US012796342B2

(12) United States Patent
Yang

(10) Patent No.: US 12,796,342 B2
(45) Date of Patent: Nov. 10, 2026

(54) PHASE CHANGE MATERIAL (PCM) RADIO FREQUENCY (RF) SWITCH WITH PCM RECESS AND METHOD FOR FORMING THE SAME

(71) Applicant: Taiwan Semiconductor Manufacturing Company, Ltd., Hsinchu (TW)

(72) Inventor: Tsung-Hsueh Yang, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 338 days.

(21) Appl. No.: 18/610,747

(22) Filed: Mar. 20, 2024

(65) Prior Publication Data

US 2025/0107457 A1 Mar. 27, 2025

Related U.S. Application Data

(60) Provisional application No. 63/584,558, filed on Sep. 22, 2023.

(51) Int. Cl.
*H10N 70/00* (2023.01)
*H10N 70/20* (2023.01)

(52) U.S. Cl.
CPC ......... *H10N 70/231* (2023.02); *H10N 70/021* (2023.02); *H10N 70/041* (2023.02);
(Continued)

(58) Field of Classification Search
CPC .. H10N 70/231; H10N 70/021; H10N 70/041; H10N 70/063; H10N 70/841;
(Continued)

(56) References Cited

U.S. PATENT DOCUMENTS

2009/0026432 A1* 1/2009 Liu .................... H10N 70/8413 257/E21.09
2009/0184309 A1* 7/2009 Mathew ............... H10N 70/231 438/102

(Continued)

OTHER PUBLICATIONS

Wikipedia.org "RF Switch" The date of publication is unknown. Retrieved online on Nov. 3, 2023 from https://en.wikipedia.org/wiki/RF_switch.

(Continued)

*Primary Examiner* — Syed I Gheyas
(74) *Attorney, Agent, or Firm* — Eschweiler & Potashnik, LLC

(57) ABSTRACT

Various embodiments of the present disclosure are directed to a phase change material (PCM) radio frequency (RF) switch with a PCM recess. A PCM structure overlies a heater, and a first electrode and a second electrode are respectively on and electrically coupled to opposite sides of the PCM structure. The PCM recess is in a top of the PCM structure and overlies the heater at an active portion of the PCM structure. Further, the PCM recess has a width that is the same as or substantially the same as the active portion. The active portion is configured to change between a crystalline phase and an amorphous phase, whereas a remainder of the PCM structure (e.g., an inactive portion) is in the crystalline phase. Because of the PCM recess, the PCM structure has a smaller thickness at the active portion than at the inactive portion.

20 Claims, 24 Drawing Sheets

(52) U.S. Cl.
CPC ......... *H10N 70/063* (2023.02); *H10N 70/841* (2023.02); *H10N 70/8613* (2023.02)

(58) Field of Classification Search
CPC ............. H10N 70/8613; H10N 70/826; H10N 70/8413; H10N 70/8828; H10N 70/011; H10N 70/821
See application file for complete search history.

(56) References Cited

U.S. PATENT DOCUMENTS

2009/0236583 A1* 9/2009 Kuo ................... H10N 70/8828 438/54
2014/0264230 A1* 9/2014 Borodulin ............ H10N 70/026 257/4
2020/0058857 A1* 2/2020 Rose .................... H10N 70/011
2023/0189672 A1 6/2023 Li et al.

OTHER PUBLICATIONS

MicroChemicals. "Lift-Off" The date of publication is unknown. Retrieved online on Nov. 3, 2023 from www.microchemicals.com/downloads/application_notes.html.
Tech Design Forum. "10nm Processes" The date of publication is unknown. Retrieved online on Nov. 5, 2023 from https://www.techdesignforums.com/practice/tag/10nm/.
Analog Devices. "RF Switches" The date of publication is unknown. Retrieved online on Nov. 5, 2023 from https://www.analog.com/en/product-category/rf-switches.html.

* cited by examiner

PHASE CHANGE MATERIAL (PCM) RADIO FREQUENCY (RF) SWITCH WITH PCM RECESS AND METHOD FOR FORMING THE SAME

REFERENCE TO RELATED APPLICATION

This application claims the benefit of U.S. Provisional Application No. 63/584,558, filed on Sep. 22, 2023, the contents of which are incorporated by reference in their entirety.

BACKGROUND

Radio frequency (RF) switches are devices used to route high frequency signals and are commonly used in wireless communication systems. For example, RF switches may be found in cell phones, WiFi routers, and so on. Compared to complementary metal-oxide semiconductor (CMOS) switches, RF switches generally have higher power handling, better linearity, and a wider frequency band of operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
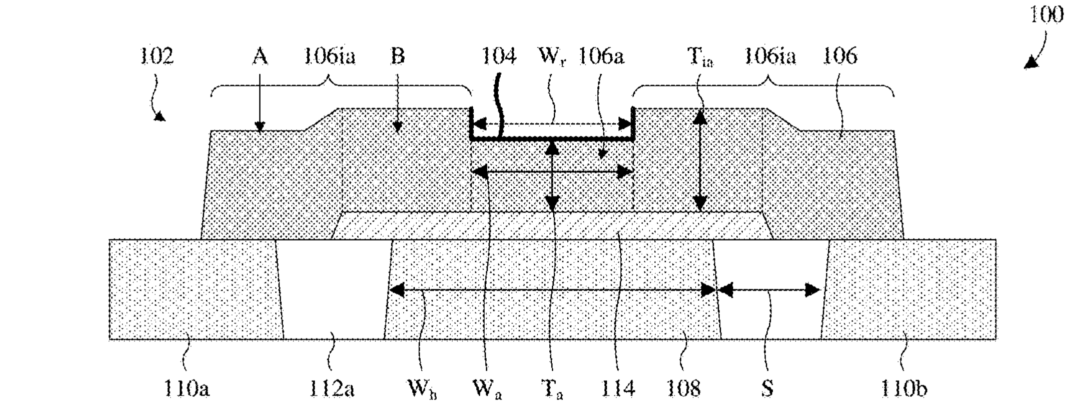
FIG. 1 illustrates a cross-sectional view of some embodiments of a phase change material (PCM) radio frequency (RF) switch with a PCM recess.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One type of radio frequency (RF) switch is a phase change material (PCM) RF switch, which comprises a heater, a PCM structure, and a pair of electrodes. The electrodes adjoin the PCM structure respectively on opposite sides of the PCM structure. The PCM structure overlies the heater and has a uniform thickness. Further, the PCM structure has an active portion and a pair of inactive portions between which the active portion is arranged.

The inactive portions are in a crystalline phase and extend from the active portion respectively to the electrodes. Because the inactive portions are in the crystalline phase, the inactive portions have a low resistance. The active portion overlies the heater and is configured to selectively change between the crystalline phase and an amorphous phase by selective heating from the heater. While in the amorphous phase, the active portion is in a high resistance state (HRS) that electrically isolates the electrodes from each other. While in the crystalline phase, the active portion is in a low resistance state (LRS) that electrically couples the electrodes together. The HRS may correspond to an OFF state for the PCM RF switch, whereas the LRS may correspond to an ON state for the PCM RF switch.

Performance of the PCM RF switch may be assessed in terms of ON resistance and thermal endurance. The lower the ON resistance, the lower the insertion losses. Increasing a thickness of the PCM structure reduces the ON resistance. However, increasing the thickness of the PCM structure also leads to voids in the PCM structure due to thermal stress while cycling the PCM RF switch. These voids predominantly form at the active portion, where thermal stress is highest, and reduce the thermal endurance of the PCM RF switch. Therefore, there is a tradeoff between ON resistance and thermal endurance.

The present disclosure is directed to a PCM RF switch with a PCM recess. The PCM recess is in a top of the PCM structure and overlies the heater at an active portion of the PCM structure. Because of the PCM recess, a thickness of the PCM RF structure may be small at the active portion. The small thickness prevents voids from forming at the active portion while under thermal stress from cycling of the PCM RF switch. This leads to a high thermal endurance for the PCM RF switch. Note that voids predominantly form at the active portion, where thermal stress is highest, whereby voids are not an issue at the inactive portions. Further, because of the PCM recess, the thickness of the PCM RF structure may be large at the inactive portions. The large thickness reduces resistance at the inactive portions and hence leads to a low ON resistance and low insertion losses. Hence, the PCM recess allows the PCM RF switch to obtain the benefits of both a small PCM thickness and a large PCM thickness.

With reference to FIG. 1, a cross-sectional view 100 of some embodiments of a PCM RF switch 102 with a PCM recess 104 is provided. The PCM RF switch 102 may also be referred to as a semiconductor device, a PCM device, or the like. The PCM recess 104 is in a top of a PCM structure 106 and overlies a heater 108 at an active portion 106*a* of the PCM structure 106. The PCM recess 104 has a width $W_r$ less than a width $W_h$ of the heater 108.

The active portion 106*a* has a width $W_a$ less than the width $W_h$ of the heater 108 and is configured to selectively change between an amorphous phase and a crystalline phase by selective heating from the heater 108. For example, the active portion 106*a* may be set to the amorphous phase by heating the active portion 106*a* to a temperature in excess of a melting temperature for a first time period and quenching (e.g., rapidly cooling) the active portion 106*a*. As another example, the active portion 106*a* may be set to the crystalline phase by heating the active portion 106*a* to a temperature above a crystallization temperature and below the melting temperature for a second time period greater than the first time period.

While in the amorphous phase, the active portion 106*a* is in a HRS. While in the crystalline phase, the active portion 106*a* is in a LRS. The HRS may correspond to an OFF state for the PCM RF switch 102, whereas the LRS may correspond to an ON state for the PCM RF switch 102. The active portion 106*a* is to be contrasted with a remainder of the PCM structure 106, which corresponds to a pair of inactive portions 106*ia*.

The pair of inactive portions 106*ia* are respectively on opposite sides of the active portion 106*a* and extend from the active portion 106*a* respectively to a first electrode 110*a* and a second electrode 110*b*. As a result, the inactive portions 106*ia* separate the first and second electrodes 110*a*, 110*b* from the active portion 106*a*. Further, the inactive portions 106*ia* are in the crystalline phase and remain in the crystalline phase during cycling (e.g., ON/OFF cycling) of the PCM RF switch 102. Because the inactive portions 106*ia* are in the crystalline phase, the inactive portions 106*ia* have a low resistance and provide low-resistance electrical paths from the active portion 106*a* respectively to the first and second electrodes 110*a*, 110*b*.

Because of the PCM recess 104, an active thickness $T_a$ at the active portion 106*a* and an inactive thickness $T_{ia}$ at the inactive portions 106*ia* are different. Particularly, the active and inactive thicknesses $T_a$, $T_{ia}$ are comparatively and respectively small and large.

The small thickness $T_a$ at the active portion 106*a* prevents voids from forming at the active portion 106*a* while under thermal stress from cycling of the PCM RF switch 102. For example, the small thickness $T_a$ may lead to faster heat dissipation that reduces thermal stress and reduces voids. By preventing voids, the small thickness $T_a$ leads to a high thermal endurance for the PCM RF switch 102. Note that voids predominantly form at the active portion 106*a*, where thermal stress is highest, whereby voids are not an issue at the inactive portions 106*ia*. The large thickness $T_{ia}$ at the inactive portions 106*ia* leads to a low resistance at the inactive portions 106*ia*. The low resistance leads to a low ON resistance for the PCM RF switch 102. Hence, the PCM recess 104 allows a the PCM RF switch 102 to obtain the benefits of both a small thickness (e.g., $T_a$) and a large thickness (e.g., $T_{ia}$).

As a ratio of the active thickness $T_a$ to the inactive thickness $T_{ia}$ (e.g., $T_a/T_{ia}$) decreases, an ON resistance of the PCM RF switch 102 deceases. For example, the ratio being 1 may yield an ON resistance of X, the ratio being 0.77 may yield an ON resistance of 0.84*X, and the ratio being 0.67 may yield an ON resistance of 0.77*X. In some embodiments, the ratio is greater than or equal to 0.5 and is less than 1. If the ratio is outside this range, an ON resistance of the PCM RF switch 102 may, for example, be high and/or thermal endurance of the PCM RF switch 102 may, for example, be low.

With continued reference to FIG. 1, each of the inactive portions 106*ia* may be divided into an A portion and a B portion. The A portion is laterally offset from the heater 108 at a periphery of the PCM structure 106. As such, the A portion is far from the heater 108 and is not heated or is minimally heated by the heater 108 during cycling of the PCM RF switch 102. Hence, the A portion is not subject to a phase change during the cycling. The B portion overlies the heater 108 and separates the A portion from the active portion 106*a*. Similar to the active portion 106*a*, the B portion is heated by the heater 108 during cycling of the PCM RF switch 102 and may exceed the melting temperature while setting the PCM RF switch 102 to the amorphous phase. However, because of the increased thickness at the B portion, heat dissipation at the B portion may be poor. Hence, the B portion may not undergo quenching and may return to the crystalline phase. Hence, the B portion is also not subject to a phase change during the cycling.

The first and second electrodes 110*a*, 110*b* are level with the heater 108 and are laterally separated from the heater 108 by a first dielectric layer 112*a* and a separation S. In some embodiments, the separation S is 0.15 micrometer or some other suitable value or range of values. Further, the first and second electrodes 110*a*, 110*b* underlie and directly contact the PCM structure 106 respectively on opposite sides of the PCM structure 106.

A passivation layer 114 overlies the heater 108 and the first dielectric layer 112*a* to separate the heater 108 from the PCM structure 106. Further, the passivation layer 114 is recessed into a bottom of the PCM structure 106, such that the passivation layer 114 and the PCM structure 106 have individual bottom surfaces that are level with each other.

During use of the PCM RF switch 102, the first and second electrodes 110*a*, 110*b* serve as RF transmission lines or are otherwise electrically coupled to RF transmission lines. A signal is input into the first electrode 110*a* and is selectively passed to the second electrode 110*b* depending on an ON/OFF state of the PCM RF switch 102. Further, the heater 108 is controlled to change the PCM RF switch 102 between an ON state and an OFF state. Compared to complementary metal-oxide semiconductor (CMOS) switches, the PCM RF switch 102 has higher power handling, better linearity, and a wider frequency band of operation.

In some embodiments, while the PCM RF switch 102 is in the ON state, the PCM structure 106 is entirely crystalline.

Further, in some embodiments, while the PCM RF switch 102 is in the OFF state, the active portion 106*a* (demarcated by dashed lines) is entirely amorphous and a remainder of the PCM structure 106 is entirely crystalline.

In some embodiments, the first and second electrodes 110*a*, 110*b* are or comprise tungsten and/or some other suitable material having low resistance and high heat resistance. In some embodiments, the heater 108 is or comprises tungsten and/or some other suitable material having low resistance and high heat resistance. In some embodiments, the PCM structure 106 is or comprises germanium telluride and/or some other suitable phase change material. In some embodiments, the first dielectric layer 112*a* is or comprises silicon oxide, some other suitable oxide and/or dielectric, or any combination of the foregoing. In some embodiments, the passivation layer 114 is or comprises silicon nitride and/or some other suitable dielectric.

In some embodiments, the active thickness $T_a$ is about 500-1000 angstroms, about 500-750 angstroms, about 750-1000 angstroms, or some other suitable value or range of values. If the active thickness $T_a$ is too large (e.g., more than 1000 angstroms), voids may form at the active portion 106*a* while under thermal stress from cycling of the PCM RF switch 102. Hence, thermal endurance of the PCM RF switch 102 may be low. If the active thickness $T_a$ is too small (e.g., less than 500 angstroms), a maximum current of the PCM RF switch 102 may be low and/or an ON resistance of the PCM RF switch 102 may be high.

In some embodiments, the inactive thickness $T_{ia}$ is about 750-1500 angstroms, about 750-1125 angstroms, about 1125-1500 angstroms, or some other suitable value or range of values. If the inactive thickness $T_{ia}$ is too small (e.g., less than 750 angstroms), a maximum current of the PCM RF switch 102 may be low and/or an ON resistance of the PCM RF switch 102 may be high. If the inactive thickness $T_{ia}$ is too large (e.g., more than 1500), a height of the PCM RF switch 102 may be high and may lead to a large amount of topographical variation at the PCM RF switch 102. Such topographical variation may be disruptive to semiconductor process uniformity and may lead to low manufacturing yields for the PCM RF switch 102.

In some embodiments, the width $W_r$ of the PCM recess 104 is or comprises 0.4 micrometers, 0.35-0.45 micrometers, or some other suitable value or range of values. Further, in some embodiments, the width $W_a$ of the active portion 106*a* is or comprises 0.4 micrometers, 0.35-0.45 micrometers, or some other suitable value or range of values. In some embodiments, the width $W_r$ of the PCM recess 104 and the width $W_a$ of the active portion 106*a* are the same or substantially the same as each other. In other embodiments, the width $W_r$ of the PCM recess 104 is greater than the width $W_a$ of the active portion 106*a*.

In some embodiments, a ratio of the width $W_a$ of the active portion 106*a* to the width $W_r$ of the PCM recess 104 (e.g., $W_a/W_r$) is greater than or equal to 0.9 and less than or equal to 1. If the ratio is too small (e.g., less than 0.9), the PCM recess 104 may extend a large amount into the inactive portions 106*ia* and may materially degrade ON resistance. If the ratio is too large (e.g., more than 1), the PCM recess 104 may fail to cover a large amount of the active portion 106*a*. Hence, voids may form and materially degrade thermal endurance.

In some embodiments, the width $W_h$ of the heater 108 is or comprises 1 micrometer, 0.875-1.125 micrometers, or some other suitable value or range of values. In some embodiments, a ratio of the width $W_a$ of the active portion 106*a* to the width $W_h$ of the heater 108 (e.g., $W_a/W_h$) is about 0.4 and/or some other suitable value.

Figure 2:
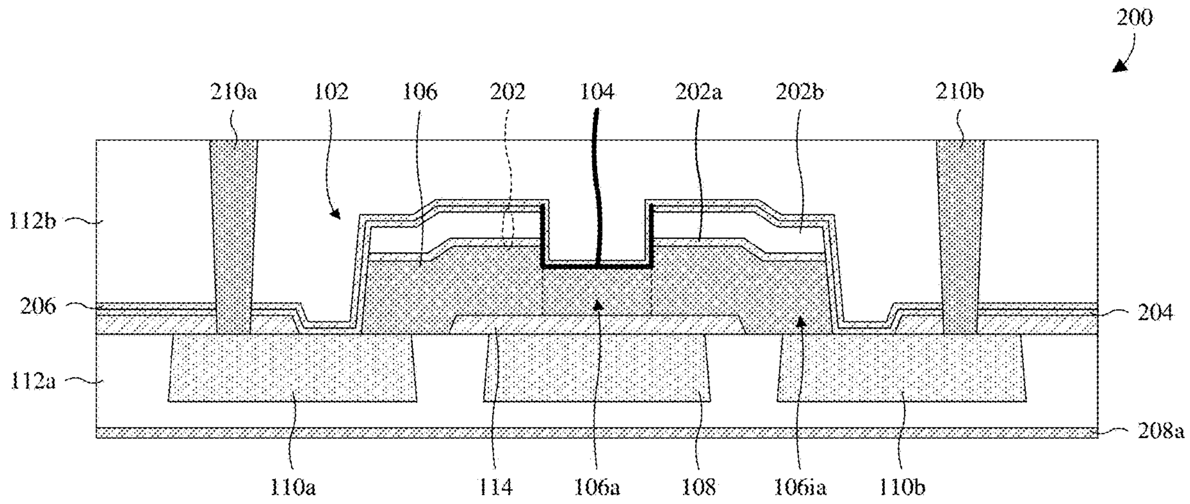
FIG. 2 illustrates an expanded cross-sectional view of some more detailed embodiments of the PCM RF switch of FIG. 1.

With reference to FIG. 2, an expanded cross-sectional view 200 of some more detailed embodiments of the PCM RF switch 102 of FIG. 1 is provided.

A hard mask 202 overlies the PCM structure 106 outside the PCM recess 104, which is extended through the hard mask 202. Further, the hard mask 202 comprises a first hard mask layer 202*a* and a second hard mask layer 202*b* overlying the first hard mask layer 202*a*. In alternative embodiments, the first hard mask layer 202*a* or the second hard mask layer 202*b* is omitted. The first hard mask layer 202*a* may, for example, be or comprise silicon nitride and/or some other suitable dielectric(s), whereas the second hard mask layer 202*b* may, for example, be or comprise silicon oxide and/or some other suitable dielectric(s), or vice versa.

A first cap layer 204 overlies the hard mask 202 outside the PCM recess 104, which is extended through the first cap layer 204. Further, the first cap layer 204 extends to the first and second electrodes 110*a*, 110*b* along a pair of first common sidewalls, which are formed by the PCM structure 106 and the hard mask 202 and which face away from each other respectively on opposite sides of the PCM structure 106. The first cap layer 204 may, for example, be or comprise silicon nitride and/or some other suitable dielectric (s). In some embodiments, the first cap layer 204 is the same material as the first hard mask layer 202*a*.

A second cap layer 206 overlies and lines the first cap layer 204 and further lines the PCM recess 104. Further, the first cap layer 204, the hard mask 202, and the PCM structure 106 form a pair of second common sidewalls opposing each other in the PCM recess 104 and lined by the second cap layer 206. The second cap layer 206 may, for example, be or comprise silicon nitride and/or some other suitable dielectric(s). In some embodiments, the second cap layer 206 is the same material as the first hard mask layer 202*a* and/or as the first cap layer 204.

The passivation layer 114 includes a trio of segments laterally spaced from each other and respectively overlying the heater 108 and the first and second electrodes 110*a*, 110*b*. Further, the segments underlie the first and second cap layers 204, 206. The passivation layer 114 may, for example, be or comprise silicon nitride and/or some other suitable dielectric(s). In some embodiments, the passivation layer 114 is the same material as at least one or more of the first hard mask layer 202*a*, the first cap layer 204, or the second cap layer 206.

The first dielectric layer 112*a* is extended under the first and second electrodes 110*a*, 110*b* and the heater 108. As such, the first dielectric layer 112*a* spaces the first and second electrodes 110*a*, 110*b* and the heater 108 from a first etch stop layer 208*a*, which underlies the first dielectric layer 112*a*. In alternative embodiments, the first etch stop layer 208*a* is omitted. The first etch stop layer 208*a* is a different dielectric material than the first dielectric layer 112*a* and may, for example, be or comprise silicon carbide and/or some other suitable dielectric(s).

A second dielectric layer 112*b* overlies the PCM RF switch 102. The second dielectric layer 112*b* may, for example, be or comprise silicon oxide, some other suitable oxide and/or dielectric, or any combination of the foregoing. In some embodiments, the second dielectric layer 112*b* is the same dielectric material as the first dielectric layer 112*a*.

A first via 210*a* and a second via 210*b* are respectively on opposite sides of the PCM RF switch 102. Further, the first and second vias 210*a*, 210*b* respectively overlie and extend from the first and second electrodes 110*a*, 110*b* to a top of the second dielectric layer 112*b*. The first and second vias 210*a*, 210*b* may, for example, be or comprise aluminum, copper, aluminum copper, some other suitable metal(s), or any combination of the foregoing.

Figure 3:
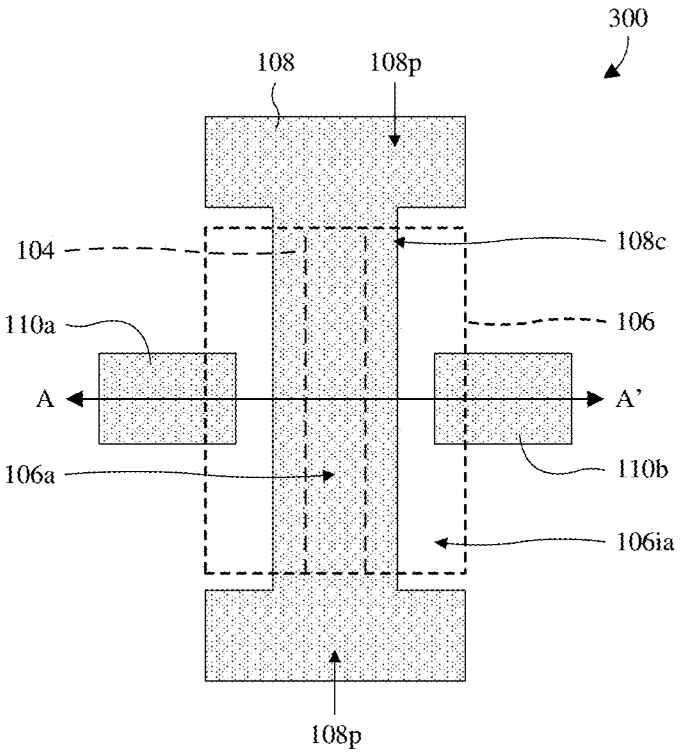
FIG. 3 illustrates a top layout view of some embodiments of the PCM RF switch of FIG. 2.

With reference to FIG. 3, a top layout view 300 of some embodiments of the PCM RF switch 102 of FIG. 2 is provided. The cross-sectional view 200 of FIG. 2 may, for example, be taken along line A-A' in FIG. 3. Further, the PCM structure 106 and the PCM recess 104 are shown in phantom, and the PCM recess 104 extends an entire length of the PCM structure 106.

The heater 108 comprises a central portion 108*c* and a pair of pad portions 108*p*. The central portion 108*c* has a columnar shape elongated between the pad portions 108*p*, in a first dimension along which the PCM recess 104 and the PCM structure 106 are also elongated. Further, the central portion 108*c* is laterally between and borders the first and second electrodes 110*a*, 110*b* in a second dimension orthogonal to the first dimension. The pad portions 108*p* are respectively on opposite ends of the central portion 108*c* and have rectangular shapes. In some embodiments, the heater 108 has I shape. In alternative embodiments, at least one or more of the central portion 108*c* or the pad portions 108*p* has/have some other suitable shape.

Figure 4:
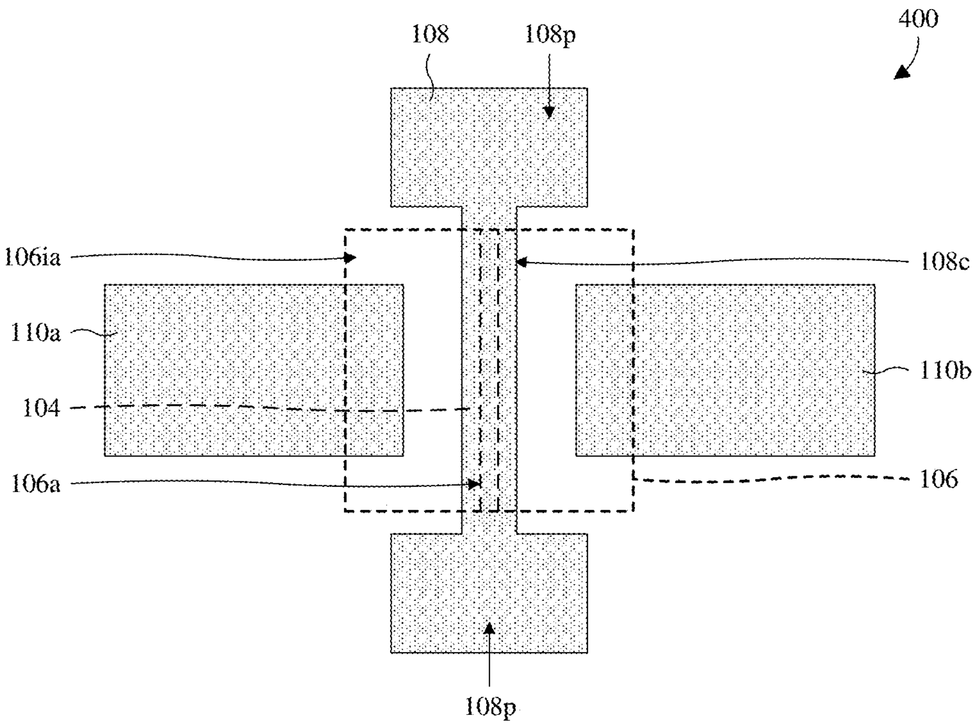
FIG. 4 illustrates a top layout view of some alternative embodiments of the PCM RF switch of FIG. 3 in which dimensions are varied.

With reference to FIG. 4, a top layout view 400 of some alternative embodiments of the PCM RF switch 102 of FIG. 3 is provided in which dimensions are varied.

With reference to FIGS. 5A-5F, cross-sectional views 500A-500F of some alternative embodiments of the PCM RF switch 102 of FIG. 2 are provided.

Figure 5A:
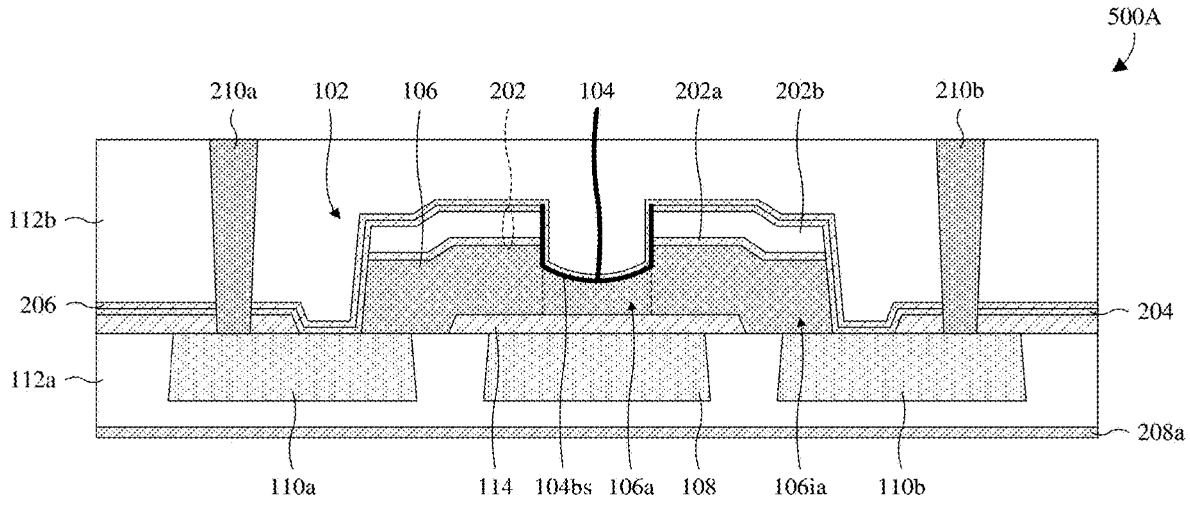
FIGS. 5A-5F illustrate cross-sectional views of some alternative embodiments of the PCM RF switch of FIG. 2.

In FIG. 5A, a bottom surface 104*bs* of the PCM recess 104 has a concave profile, such that edges of the bottom surface 104*bs* are farther from the heater 108 than a width-wise center of the bottom surface 104*bs*. In alternative embodiments, the bottom surface 104*bs* has a convex profile or some other suitable profile.

Figure 5B:
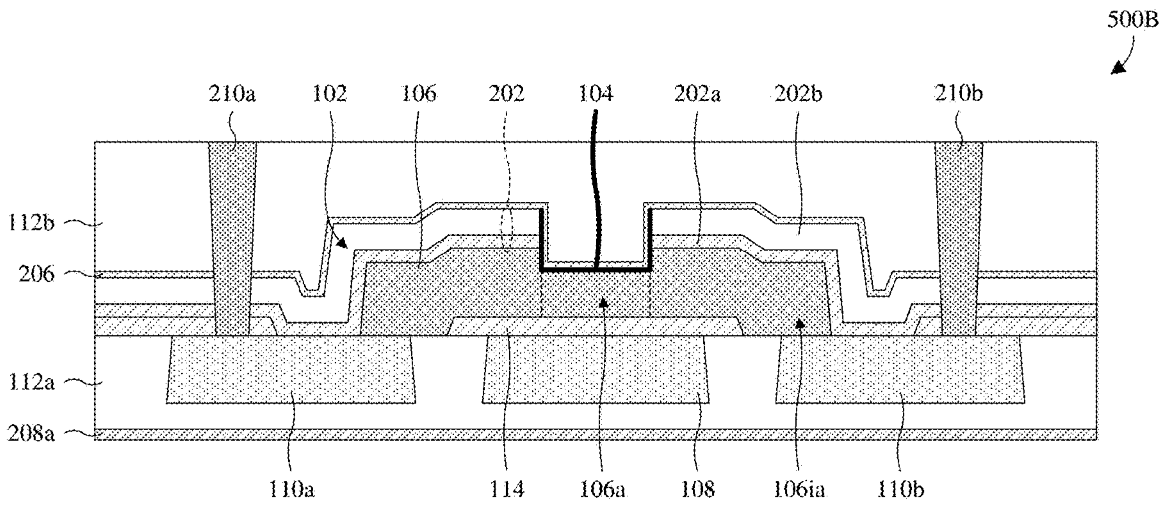

In FIG. 5B, the hard mask 202 extends along outer sidewalls of the PCM structure 106 and overlies segments of the passivation layer 114 that overlie the first and second electrodes 110*a*, 110*b*. Further, the first cap layer 204 is omitted and the second cap layer 206 lines the hard mask 202 laterally beyond the PCM structure 106.

Figure 5C:
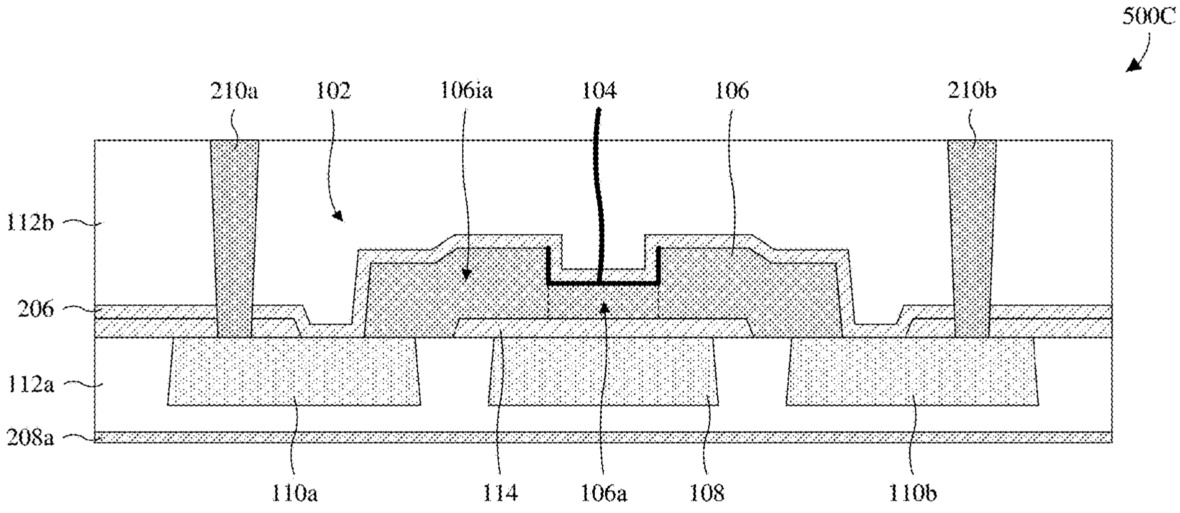

In FIG. 5C, the hard mask 202 and the first cap layer 204 are omitted.

Figure 5D:
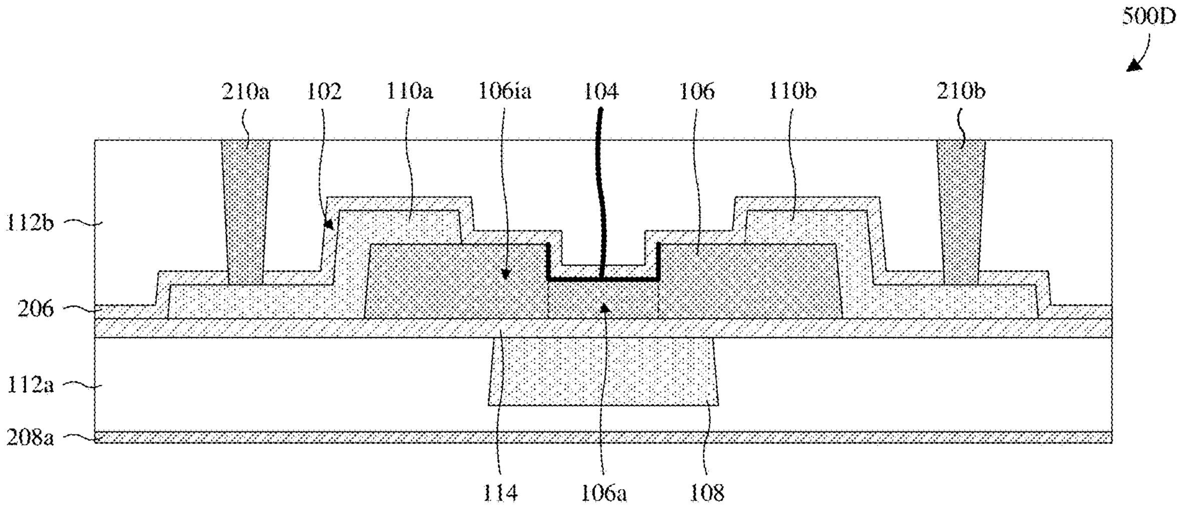

In FIG. 5D, the hard mask 202 and the first cap layer 204 are omitted, and the passivation layer 114 is continuous. Further, the first and second electrodes 110*a*, 110*b* overlie the passivation layer 114 and the PCM structure 106 and extend along outer sidewalls of the PCM structure 106. This may reduce the height of the first and second vias 210*a*, 210*b*, which may shorten the connection distance to the first and second electrodes 110*a*, 110*b*. The reduced connection distance may reduce an ON resistance of the PCM RF switch 102.

Figure 5E:
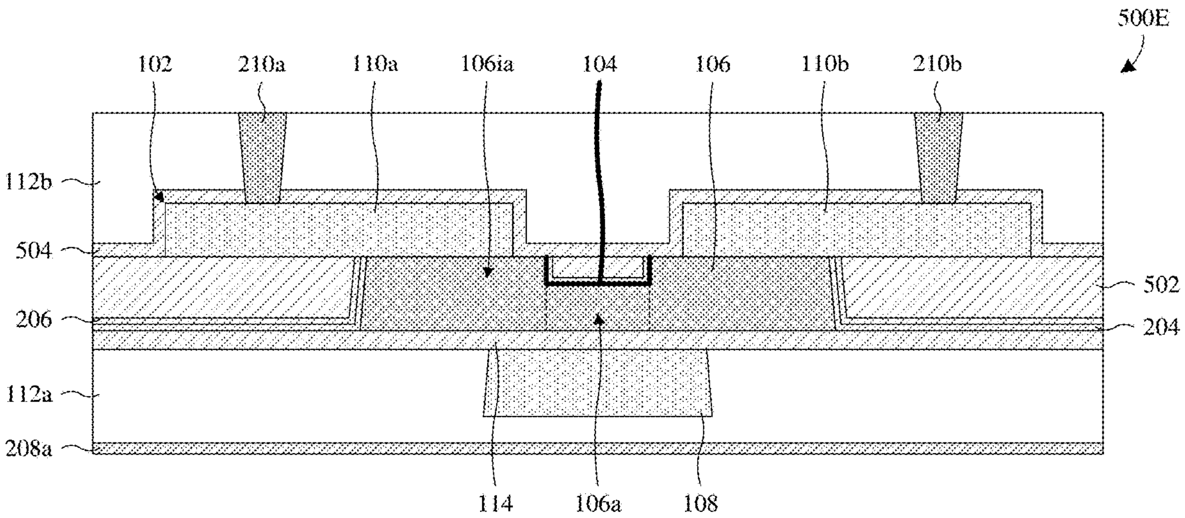
Figure 5F:
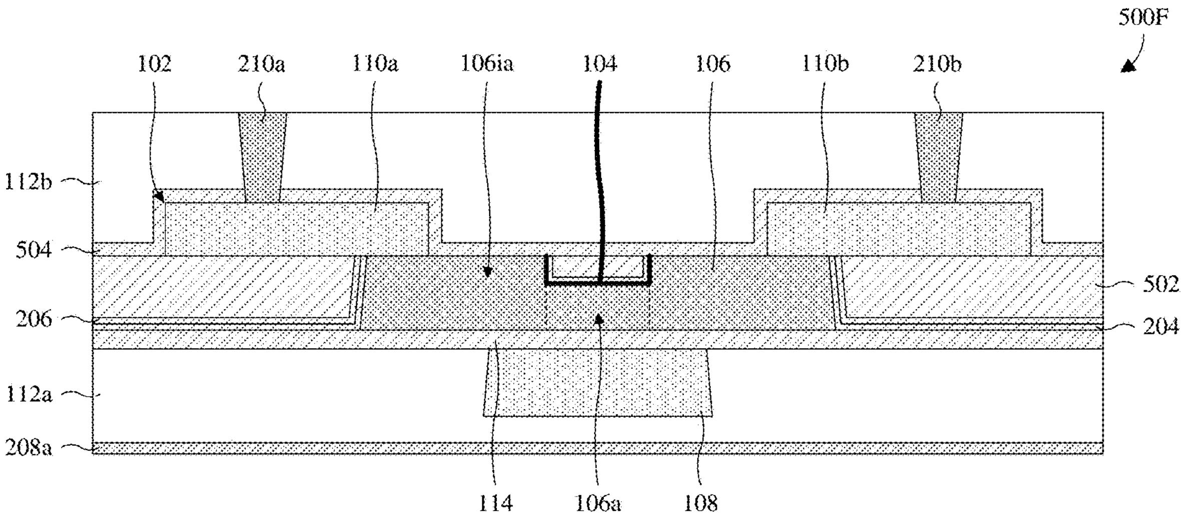

In FIG. 5E, the hard mask 202 is omitted, and the passivation layer 114 is continuous. Further, a planarization dielectric layer 502 fills the PCM recess 104 over the second cap layer 206 and further overlies the first and second cap layers 204, 206 laterally offset from the PCM structure 106. As seen hereafter, the planarization dielectric layer 502 may aid a planarization process while forming the PCM RF switch 102 of FIG. 5E. The first and second cap layers 204, 206, the PCM structure 106, and the planarization dielectric layer 502 have individual top surfaces that are level with each other and that collectively form a flat surface.

The first and second electrodes 110*a*, 110*b*, a third cap layer 504, and the second dielectric layer 112*b* overlie the flat surface. The first and second electrodes 110*a*, 110*b* have a planar profile overlying the PCM structure 106, respectively on opposite sides of the PCM structure 106. The third cap layer 504 overlies and lines the first and second electrodes 110*a*, 110*b*, and the second dielectric layer 112*b* overlies the third cap layer 504.

As with FIG. 5D, arranging the first and second electrodes 110*a*, 110*b* over the PCM structure 106 may reduce the height of the first and second vias 210*a*, 210*b*. This may, in turn, shorten the connection distance to the first and second electrodes 110*a*, 110*b*, which may reduce an ON resistance of the PCM RF switch 102.

In some embodiments, the planarization dielectric layer 502 is or comprises silicon oxide, some other suitable oxide and/or dielectric, or any combination of the foregoing. In some embodiments, the planarization dielectric layer 502 is the same material as the first dielectric layer 112*a* and/or is the same material as the second dielectric layer 112*b*. In some embodiments, the third cap layer 504 is or comprises silicon nitride and/or some other suitable dielectric(s). In some embodiments, the third cap layer 504 is the same material as one or more of the first cap layer 204, the second cap layer 206, or the passivation layer 114.

In FIG. 5E, the PCM RF switch 102 is largely as in FIG. 5E. However, a separation between the first and second electrodes 110*a*, 110*b* has been increased.

Figure 6:
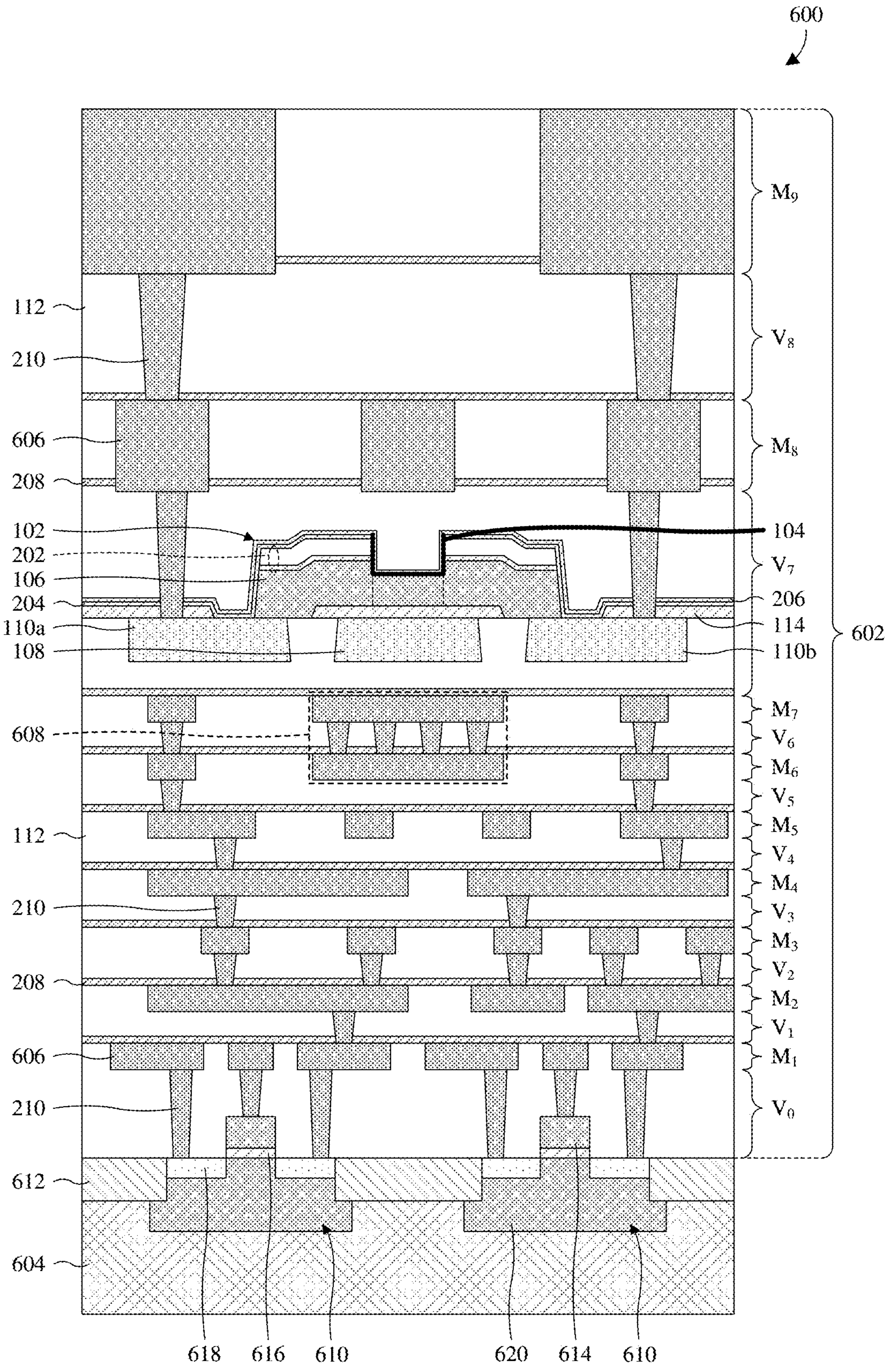
FIG. 6 illustrates a cross-sectional view of some embodiments of an integrated chip comprising the PCM RF switch of FIG. 2.

With reference to FIG. 6, a cross-sectional view 600 of some embodiments of an integrated chip comprising the PCM RF switch 102 of FIG. 2 is provided. In alternative embodiments, the PCM RF switch 102 is as in any of FIGS. 5A-5F.

An interconnect structure 602 overlies a semiconductor substrate 604 and comprises a plurality of wires 606 and a plurality of vias 210. The plurality of wires 606 are grouped into a plurality of wire levels, and the plurality of vias 210 are grouped into a plurality of via levels alternatingly stacked with the plurality of wire levels.

The wire levels are labeled $M_1$, $M_2$, and so on to $M_9$ from a bottom of the interconnect structure 602 to a top of the interconnect structure 602. Further, the wires 606 at wire level $M_8$ and $M_9$ have greater heights than their counterparts at lower wire levels. The via levels are labeled $V_0$, $V_1$, and so on to $V_8$ from the bottom of the interconnect structure 602 to the top of the interconnect structure 602. Further, the vias 210 at via levels $V_0$, $V_7$, and $V_8$ have greater heights than their counterparts at other via levels.

In alternative embodiments, the interconnect structure 602 has more or less wire levels and/or more or less via levels. Further, in alternative embodiments, the interconnect structure 602 further comprises a middle end of line (MEOL) underlying the via level $V_0$. The MEOL comprises a pair of contact levels, which may also be referred to as CA and CB.

A dielectric structure surrounds the interconnect structure 602 and comprises a plurality of interconnect dielectric layers 112 and a plurality of etch stop layers 208. The interconnect dielectric layers 112 and the etch stop layers 208 are alternatingly stacked from a bottom of the interconnect structure 602 to a top of the interconnect structure 602. The etch stop layers 208 enhance control over etching to form the various wire and via levels.

In some embodiments, the etch stop layers 208 are or comprise silicon carbide and/or some other suitable dielectric(s). In some embodiments, the plurality of interconnect dielectric layers 112 are or comprise undoped silicate glass (USG), borosilicate glass (BSG), silicon oxide, some other suitable dielectric, or any combination of the foregoing.

The PCM RF switch 102 is in the interconnect structure 602, vertically between the wire level $M_7$ and the wire level $M_8$. In alternative embodiments, the PCM RF switch 102 is vertically between two other wire levels vertically neighboring in the interconnect structure 602. The interconnect structure 602 electrically couples to the PCM RF switch 102 to facilitate electrical routing of RF signals respectively to and from the first and second electrodes 110*a*, 110*b* and to further facilitate control over the heater 108.

As noted above, the PCM RF switch 102 is as in FIG. 2. In alternative embodiments, the PCM RF switch 102 is as in any of FIGS. 5A-5F or as in any subsequent figure. Further, it is to be appreciated that the first etch stop layer 208*a* in FIG. 2 may correspond to one of the plurality of etch stop layers 208, and the first and second dielectric layers 112*a*, 112*b* in FIG. 2 may correspond to two of the interconnect dielectric layers 112. Similarly, the first and second vias 210*a*, 210*b* in FIG. 2 may correspond to two of the vias 210.

A heat sink 608 underlies the heater 108 in the interconnect structure 602. The heat sink 608 is formed by wires at the wire level $M_7$ and the wire level $M_6$, as well by vias at the via level $V_6$. The heat sink 608 facilitates dissipation of heat while cycling the PCM RF switch 102. For example, the heat sink 608 may aid in quenching the active portion 106*a* (see FIG. 2) of the PCM structure 106 while transitioning the PCM RF switch 102 to the OFF state.

A pair of logic devices 610 underlie and electrically couple to the interconnect structure 602, between the interconnect structure 602 and the semiconductor substrate 604. Further, the logic devices 610 are partially formed in the semiconductor substrate 604. In alternative embodiments, there may be more or less logic devices 610 and/or there may additionally or alternatively be devices other than logic devices. In some embodiments, the semiconductor substrate 604 is or comprises silicon and/or the like.

The logic devices 610 are separated from each other by an isolation structure 612. The isolation structure 612 may, for example, be or comprise a shallow trench isolation (STI) structure, a deep trench isolation (DTI) structure, a local oxidation of silicon (LOCOS) isolation structure, some other suitable type of isolation structure, or any combination of the foregoing. The logic devices 610 are illustrated as planar field-effect transistors (planar FETs). However, the logic devices 610 may alternatively be fin field-effect transistors (FinFETs), gate-all-around (GAA) field-effect transistors (GAA FETs), some other suitable type(s) of logic device and/or transistor, or any combination of the foregoing.

The logic devices 610 comprise individual gate electrodes 614, individual gate dielectric layers 616, individual pairs of source/drain regions 618, and individual wells 620. The pairs of source/drain regions 618 are inset into a top of the semiconductor substrate 604. The gate electrodes 614 respectively overlie the gate dielectric layers 616 and are respectively between the pairs of source/drain regions 618. The wells 620 correspond to doped regions of the semiconductor substrate 604 and respectively underlie the pairs of source/drain regions 618 and the gate electrodes 614. In alternative embodiments, the wells 620 are omitted.

Figure 7:
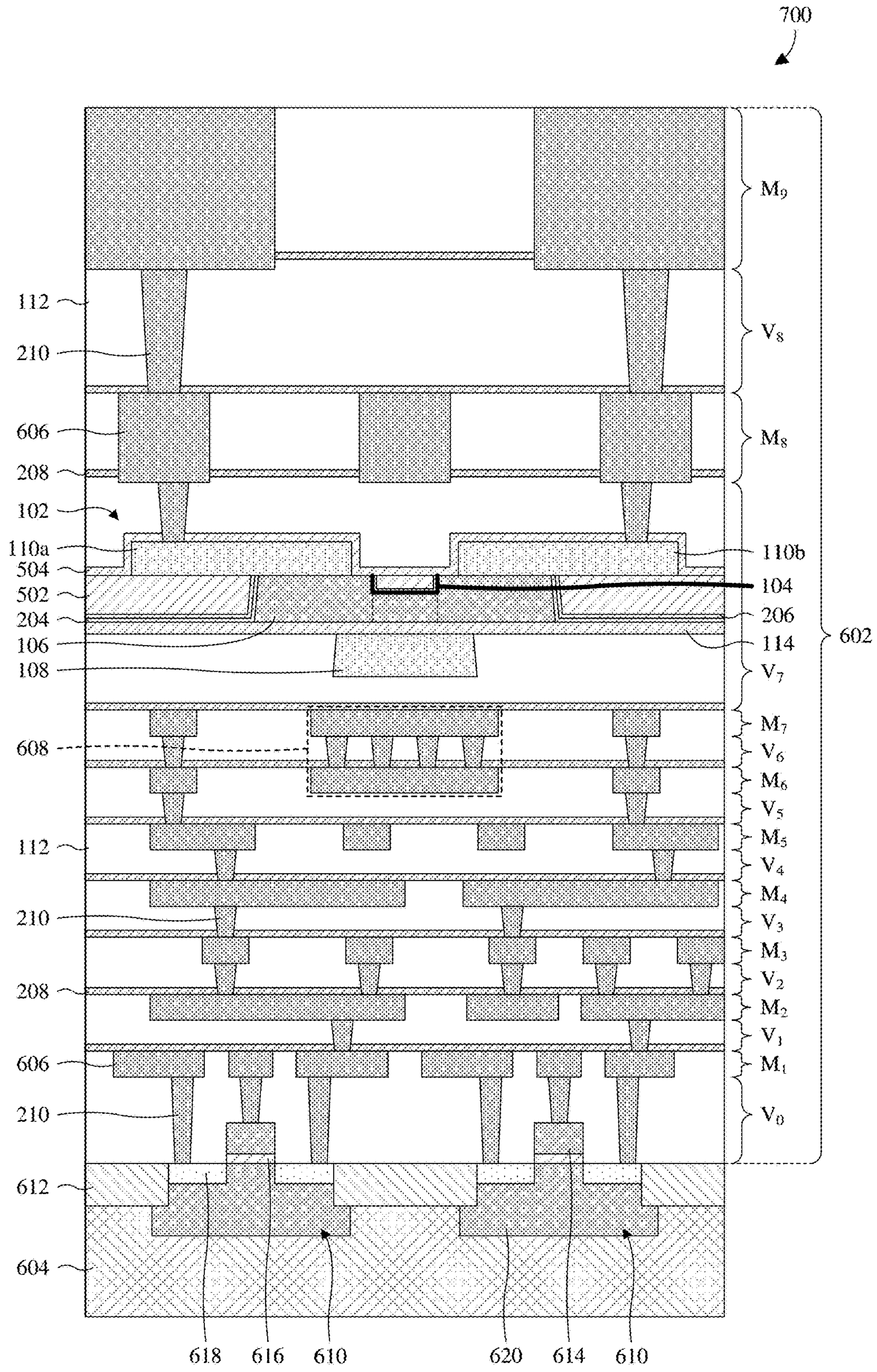
FIG. 7 illustrates a cross-sectional view of some alternative embodiments of the integrated chip of FIG. 6.

With reference to FIG. 7, a cross-sectional view 700 of some alternative embodiments of the integrated chip of FIG. 6 is provided in which the PCM RF switch 102 is as in FIG. 5E. In alternative embodiments, the PCM RF switch 102 is as in any of FIGS. 5A-5D or FIG. 5F.

With reference to FIGS. 8-21, a series of cross-sectional views 800-2100 of some embodiments of a method for forming an integrated chip comprising a PCM RF switch with a PCM recess is provided. The method may, for example, be employed to form the PCM RF switch 102 of FIG. 2 or some other suitable PCM RF switch.

Figure 8:
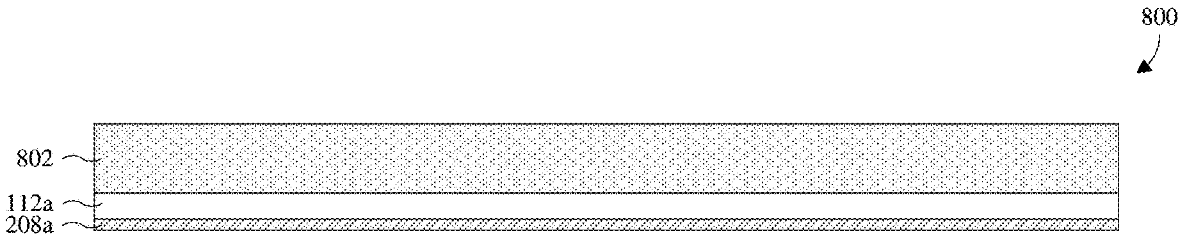
FIGS. 8-21 illustrate a series of cross-sectional views of some embodiments of a method for forming a PCM RF switch with a PCM recess.

As illustrated by the cross-sectional view 800 of FIG. 8, a conductive layer 802 is deposited overlying a first dielectric layer 112*a*. The first dielectric layer 112*a* overlies a first etch stop layer 208*a*, which overlies a substrate (not shown). In alternative embodiments, the first etch stop layer 208*a* is omitted. As seen hereafter, the first dielectric layer 112*a* may, for example, correspond to an interconnect dielectric layer or the like.

In some embodiments, the conductive layer 802 is or comprises tungsten and/or some other suitable material having low resistance and high heat resistance. In some embodiments, the first dielectric layer 112*a* is or comprises silicon oxide, some other suitable oxide and/or dielectric, or any combination of the foregoing. In some embodiments, the first etch stop layer 208*a* is or comprises silicon carbide and/or some other suitable dielectric(s).

Figure 9:
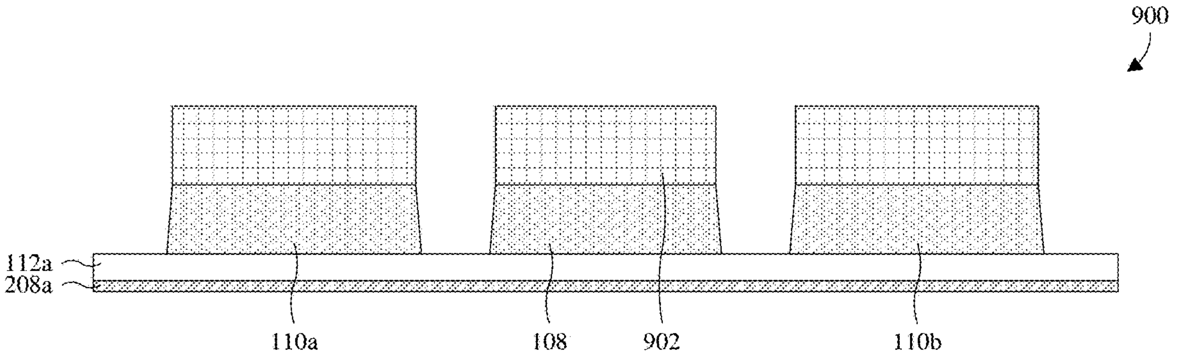

As illustrated by the cross-sectional view 900 of FIG. 9, the conductive layer 802 is patterned to form a first electrode 110*a*, a second electrode 110*b*, and a heater 108 spaced between the first and second electrodes 110*a*, 110*b*. The conductive layer 802 may, for example, be patterned so the first and second electrodes 110*a*, 110*b* and the heater 108 have individual top layouts as in FIG. 3 or FIG. 4. The patterning may, for example, be performed by or using a photolithography/etching process or some other suitable patterning process. Further, the patterning may, for example, comprise etching the conductive layer 802 while a mask 902 overlies the conductive layer 802 and subsequently removing the mask 902.

Figure 10:
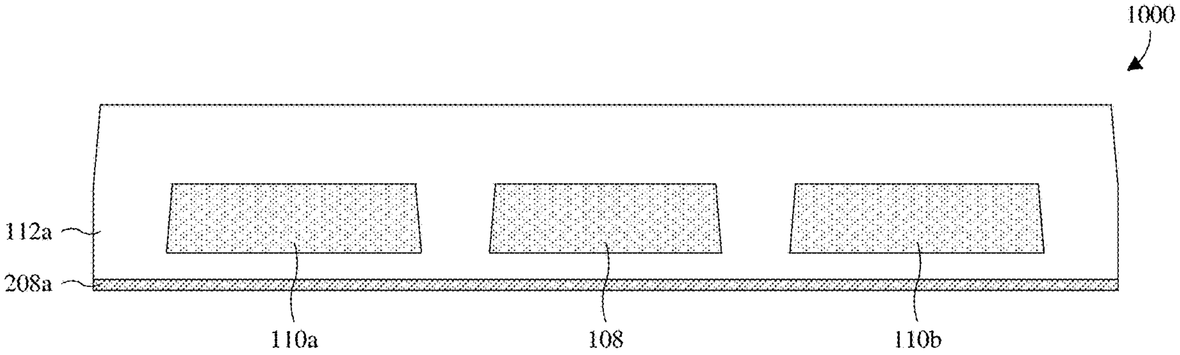

As illustrated by the cross-sectional view 1000 of FIG. 10, dielectric material is deposited over and around the first and second electrodes 110*a*, 110*b* and the heater 108 to extend the first dielectric layer 112*a*.

Figure 11:
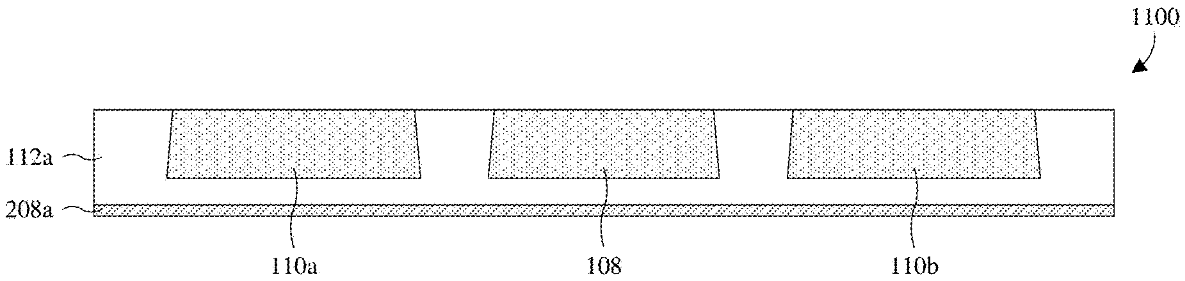

As illustrated by the cross-sectional view 1100 of FIG. 11, a planarization is performed into the first dielectric layer 112*a* to level a top surface of the first dielectric layer 112*a* with individual top surfaces of the first and second electrodes 110*a*, 110*b* and the heater 108. The planarization may, for example, be performed by a chemical mechanical planarization (CMP) and/or some other suitable planarization.

Figure 12:
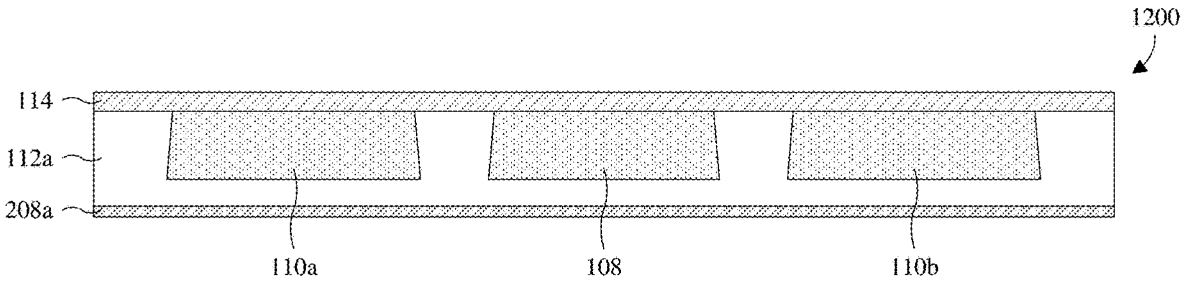

As illustrated by the cross-sectional view 1200 of FIG. 12, a passivation layer 114 is deposited on the first dielectric layer 112*a*, as well as on the first and second electrodes 110*a*, 110*b* and the heater 108. In some embodiments, the passivation layer 114 is or comprises silicon nitride and/or some other suitable dielectric.

Figure 13:
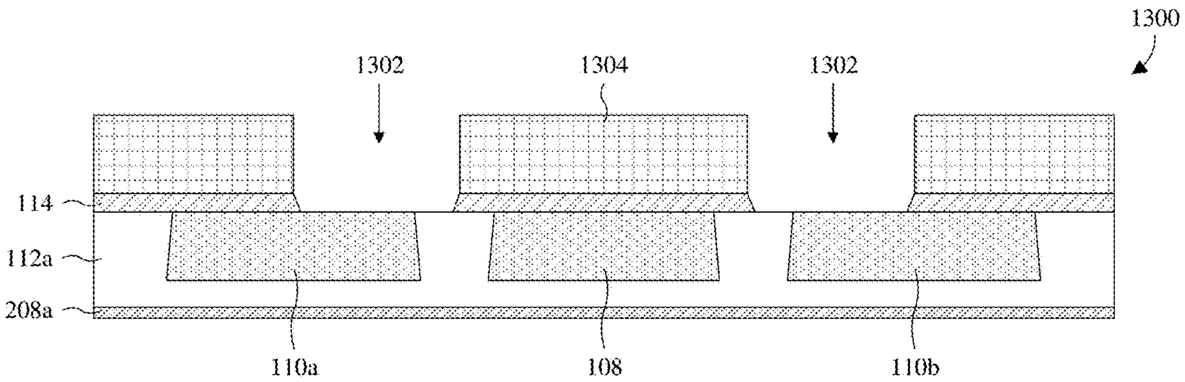

As illustrated by the cross-sectional view 1300 of FIG. 13, the passivation layer 114 is patterned to form a pair of openings 1302 laterally offset from the heater 108 and respectively overlying the first and second electrodes 110*a*, 110*b*. The patterning may, for example, be performed by or using a photolithography/etching process or some other suitable patterning process. Further, the patterning may, for example, comprise etching the passivation layer 114 while a mask 1304 overlies the passivation layer 114 and subsequently removing the mask 1304.

Figure 14:
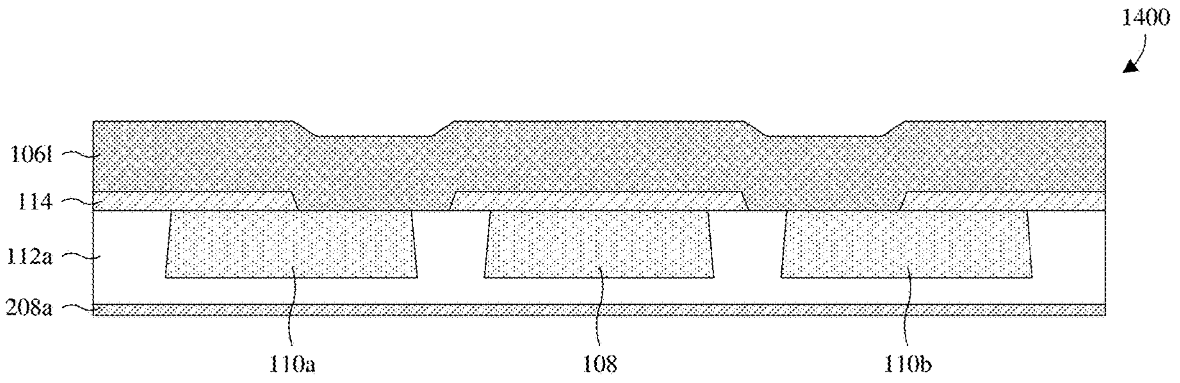

As illustrated by the cross-sectional view 1400 of FIG. 14, a PCM layer 1061 is deposited overlying the passivation layer 114 and filling the openings 1302 (see FIG. 13). In some embodiments, the PCM layer 1061 is or comprises germanium telluride and/or some other suitable phase change material.

Figure 15:
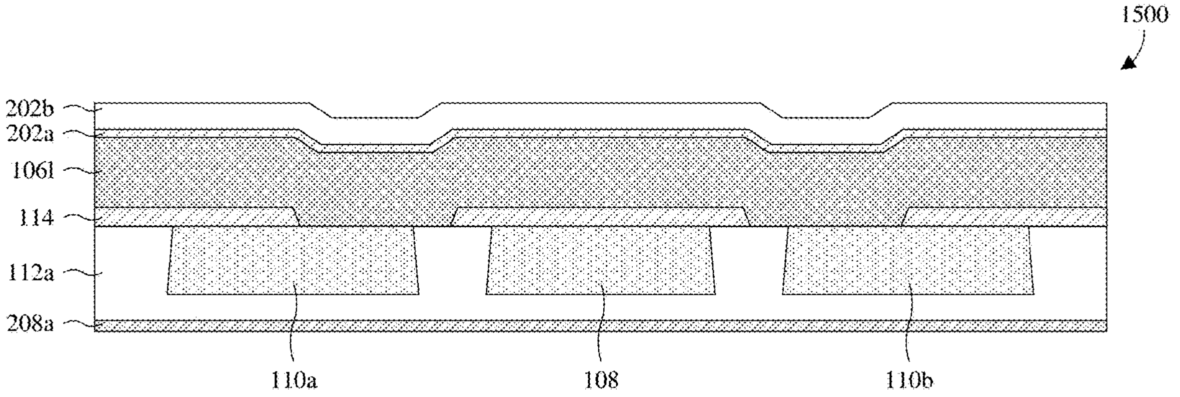

As illustrated by the cross-sectional view 1500 of FIG. 15, a first hard mask layer 202*a* and a second hard mask layer 202*b* are deposited overlying the PCM layer 1061. The first hard mask layer 202$a$ is deposited first and then the second hard mask layer 202$b$ is deposited overlying the first hard mask layer 202$a$. The second hard mask layer 202$b$ is a different material than the first hard mask layer 202$a$. The first hard mask layer 202$a$ may, for example, be or comprise silicon nitride and/or some other suitable dielectric(s). The second hard mask layer 202$b$ may, for example, be or comprise silicon oxide and/or some other suitable dielectric(s).

Figure 16:
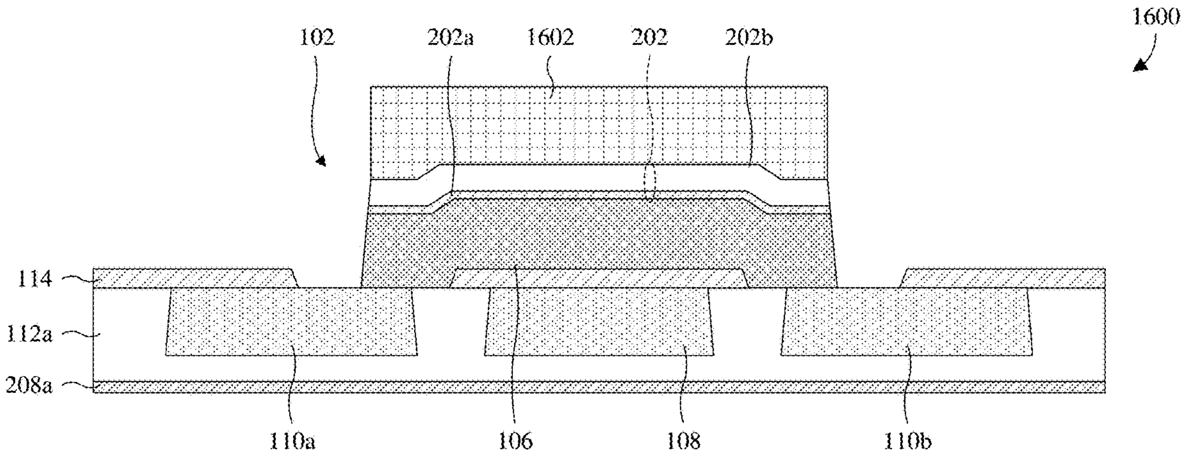

As illustrated by the cross-sectional view 1600 of FIG. 16, the PCM layer 1061, the first hard mask layer 202$a$, and the second hard mask layer 202$b$ are patterned. The patterning forms a PCM structure 106 and a hard mask 202 overlying the PCM structure 106. The PCM structure 106 covers the heater 108 and has a pair of outer sidewalls respectively overlying the first and second electrodes 110$a$, 110$b$. Collectively, the first and second electrodes 110$a$, 110$b$, the heater 108, and the PCM structure 106 form a PCM RF switch 102.

The patterning may, for example, be performed by or using a photolithography/etching process or some other suitable patterning process. Further, the patterning may, for example, comprise etching the PCM layer 1061, the first hard mask layer 202$a$, and the second hard mask layer 202$b$ while a mask 1602 overlies these layers (e.g., the second hard mask layer 202$b$) and subsequently removing the mask 1602.

Figure 17:
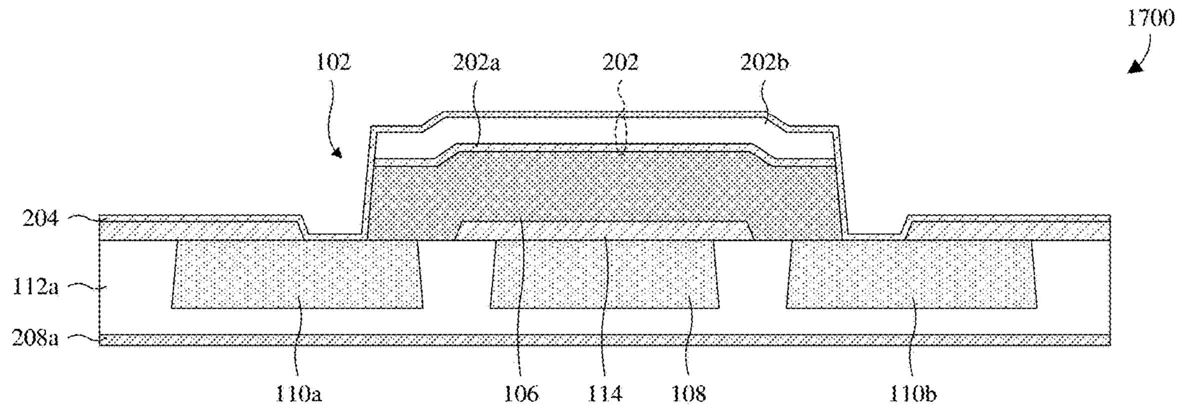

As illustrated by the cross-sectional view 1700 of FIG. 17, a first cap layer 204 is deposited overlying the passivation layer 114 and the hard mask 202, and further extending along outer sidewalls of the PCM structure 106. The first cap layer 204 may, for example, be or comprise silicon nitride and/or some other suitable dielectric. In some embodiments, the first cap layer 204 is the same material as the first hard mask layer 202$a$ and/or the passivation layer 114.

Figure 18:
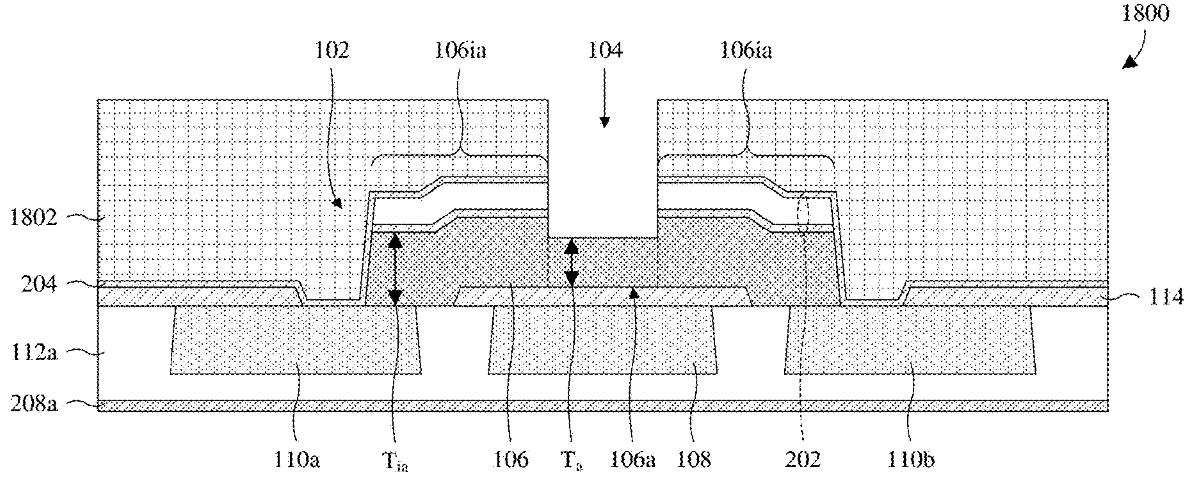

As illustrated by the cross-sectional view 1800 of FIG. 18, the first cap layer 204, the hard mask 202, and the PCM structure 106 are patterned to form a PCM recess 104 overlying the heater 108, at an active portion 106$a$ of the PCM structure 106. The patterning may, for example, be performed by or using a photolithography/etching process or some other suitable patterning process. Further, the patterning may, for example, comprise etching the first cap layer 204, the hard mask 202, and the PCM structure 106 while a mask 1802 overlies these layers (e.g., the first cap layer 204) and subsequently removing the mask 1802. The mask 1802 may, for example, be or comprise photoresist and/or some other suitable material.

The active portion 106$a$ is configured to selectively change between an amorphous phase and a crystalline phase by selective heating from the heater 108. For example, the active portion 106$a$ may be set to the amorphous phase by heating the active portion 106$a$ to a temperature in excess of a melting temperature for a first time period and quenching (e.g., rapidly cooling) the active portion 106$a$. As another example, the active portion 106$a$ may be set to the crystalline phase by heating the active portion 106$a$ to a temperature above a crystallization temperature and below the melting temperature for a second time period that is greater than the first time.

While in the amorphous phase, the active portion 106$a$ is in a HRS. While in the crystalline phase, the active portion 106$a$ is in an LRS. The HRS may correspond to an OFF state for the PCM RF switch 102, whereas the LRS may correspond to an ON state for the PCM RF switch 102. The active portion 106$a$ is to be contrasted with a remainder of the PCM structure 106, which corresponds to a pair of inactive portions 106$ia$. In some embodiments, the PCM recess 104, the active portion 106$a$, and the inactive portions 106$ia$ have dimensions (e.g., widths, thicknesses, etc.) as described with regard to FIG. 1.

The pair of inactive portions 106$ia$ are respectively on opposite sides of the active portion 106$a$ and extend from the active portion 106$a$ respectively to a first electrode 110$a$ and a second electrode 110$b$. As a result, the inactive portions 106$ia$ separate the first and second electrodes 110$a$, 110$b$ from the active portion 106$a$. Further, the inactive portions 106$ia$ are in the crystalline phase and remain in the crystalline phase during cycling (e.g., ON/OFF cycling) of the PCM RF switch 102. Because the inactive portions 106$ia$ are in the crystalline phase, the inactive portions 106$ia$ have a low resistance and provide low-resistance electrical paths from the active portion 106$a$ respectively to the first and second electrodes 110$a$, 110$b$.

Because of the PCM recess 104, an active thickness $T_a$ at the active portion 106$a$ and an inactive thickness $T_{ia}$ at the inactive portions 106$ia$ are different. Particularly, the active and inactive thicknesses $T_a$, $T_{ia}$ are comparatively and respectively small and large.

The small thickness $T_a$ at the active portion 106$a$ prevents voids from forming at the active portion 106$a$ while under thermal stress from cycling of the PCM RF switch 102. For example, the small thickness $T_a$ may lead to faster heat dissipation that reduces thermal stress and reduces voids. By preventing voids, the small thickness $T_a$ leads to a high thermal endurance for the PCM RF switch 102. Note that voids predominantly form at the active portion 106$a$, where thermal stress is highest, whereby voids are not an issue at the inactive portions 106$ia$. The large thickness $T_{ia}$ at the inactive portions 106$ia$ leads to a low resistance at the inactive portions 106$ia$. The low resistance leads to a low ON resistance for the PCM RF switch 102. Hence, the PCM recess 104 allows a the PCM RF switch 102 to obtain the benefits of both a small thickness (e.g., $T_a$) and a large thickness (e.g., $T_{ia}$).

Figure 19:
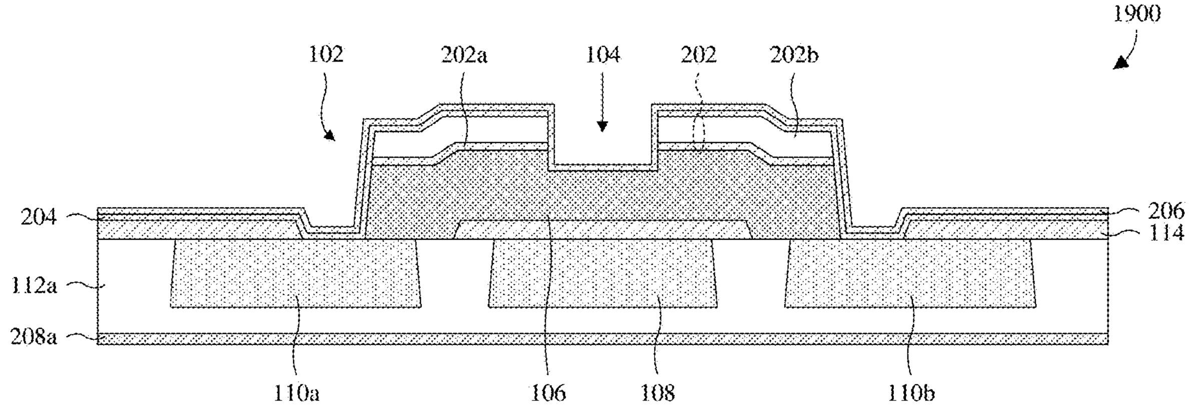

As illustrated by the cross-sectional view 1900 of FIG. 19, a second cap layer 206 is deposited over the first cap layer 204 and lining the PCM recess 104. The second cap layer 206 may, for example, be or comprise silicon nitride and/or some other suitable dielectric. In some embodiments, the second cap layer 206 is the same material as at least one of the first hard mask layer 202$a$, the passivation layer 114, or the first cap layer 204.

Figure 20:
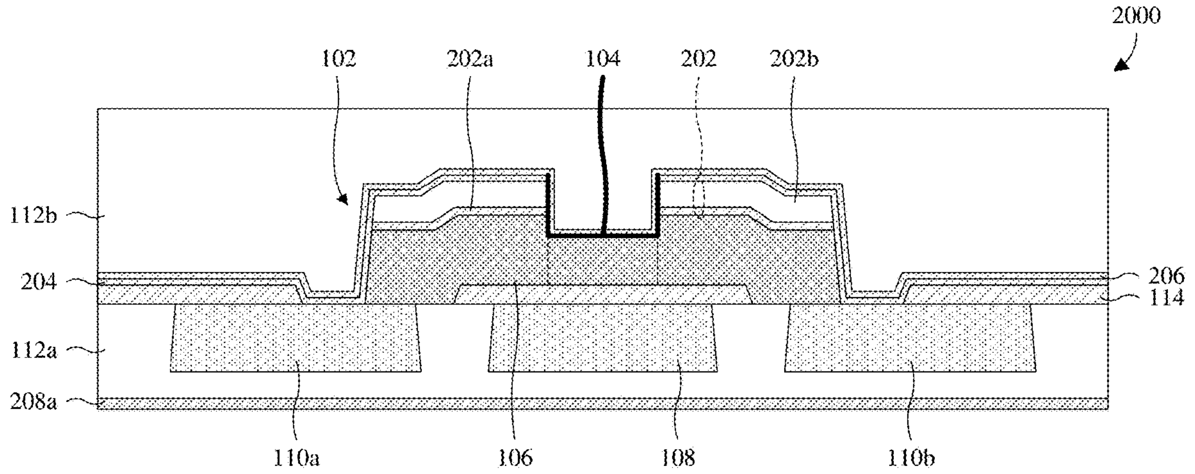

As illustrated by the cross-sectional view 2000 of FIG. 20, a second dielectric layer 112$b$ is deposited overlying the second cap layer 206 and filling the PCM recess 104. In some embodiments, the second dielectric layer 112$b$ is or comprises silicon oxide, some other suitable oxide and/or dielectric, or any combination of the foregoing. Further, in some embodiments, a planarization is performed into a top of the second dielectric layer 112$b$ to flatten the top of the second dielectric layer 112$b$. The planarization may, for example, be performed by a CMP and/or some other suitable planarization.

Figure 21:
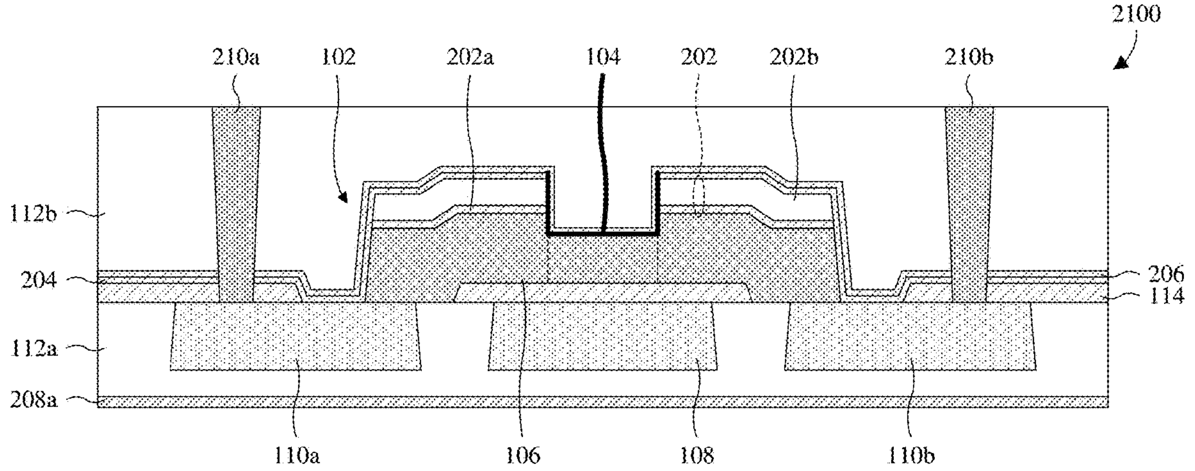

As illustrated by the cross-sectional view 2100 of FIG. 21, a first via 210$a$ and a second via 210$b$ are formed respectively overlying and extending from the first and second electrodes 110$a$, 110$b$. In some embodiments, additional vias may be formed overlying and extending from the heater 108 outside the cross-sectional view 2100 of FIG. 21. For example, to the extent that the heater 108 has a top layout as in FIG. 3 or FIG. 4, these additional vias may be formed respectively overlying and extending from the pad portions 108$p$.

While FIGS. 8-21 are described with reference to a method, it will be appreciated that the structures shown in these figures are not limited to the method but rather may stand alone separate of the method. While FIGS. 8-21 are described as a series of acts, it will be appreciated that the order of the acts may be altered in other embodiments. While FIGS. 8-21 illustrate and describe as a specific set of acts, some acts that are illustrated and/or described may be omitted in other embodiments. Further, acts that are not illustrated and/or described may be included in other embodiments.

Figure 22:
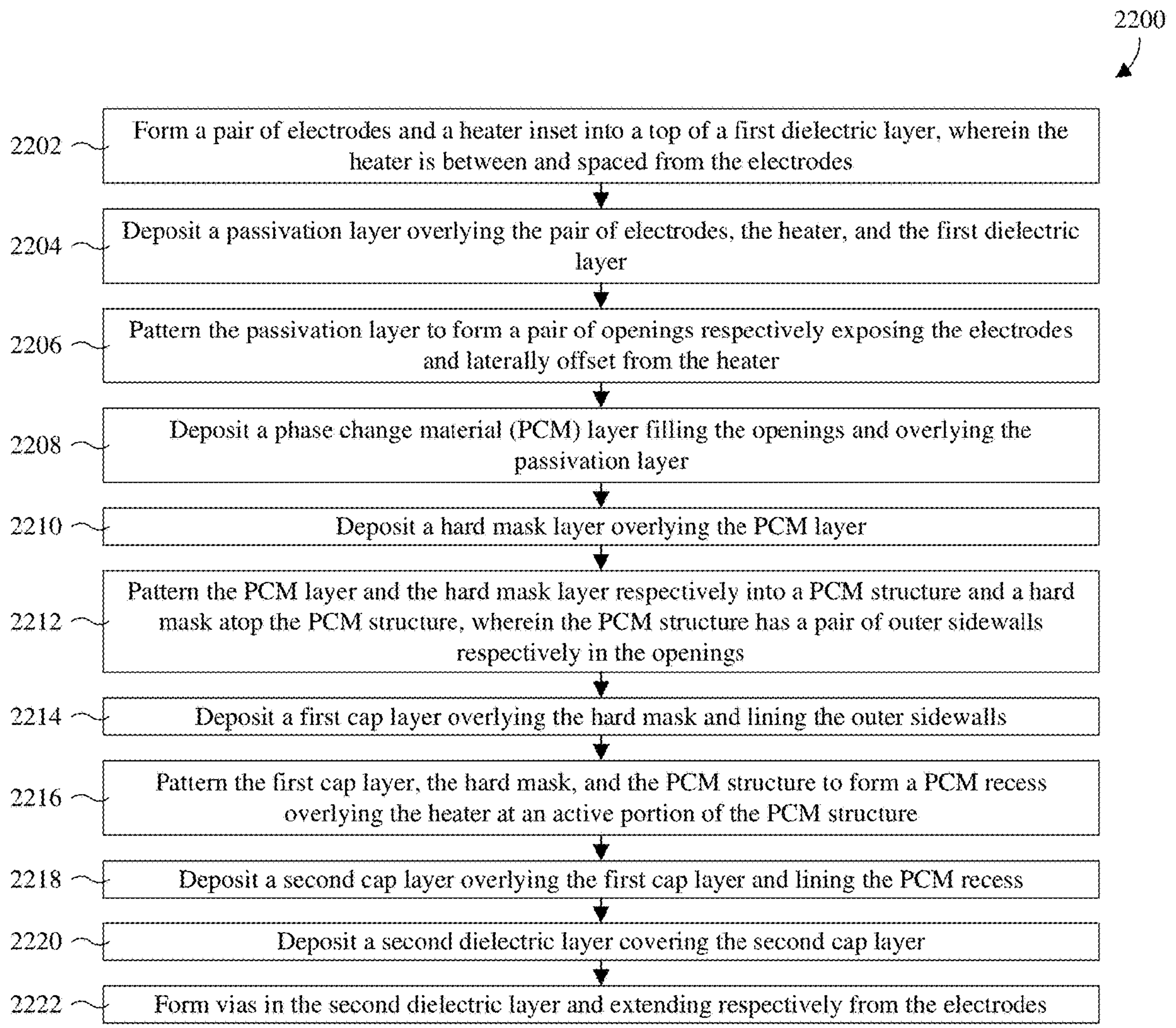
FIG. 22 illustrates a block diagram of some embodiments of the method of FIGS. 8-21.

With reference to FIG. 22, a block diagram 2200 of some embodiments of the method of FIGS. 8-21 is provided.

At block 2202, a pair of electrodes and a heater are formed inset into a top of a first dielectric layer, wherein the heater is between and spaced from the electrodes. See, for example, FIGS. 8-11.

At block 2204, a passivation layer is deposited overlying the pair of electrodes, the heater, and the first dielectric layer. See, for example, FIG. 12.

At block 2206, the passivation layer is patterned to form a pair of openings respectively exposing the electrodes and laterally offset from the heater. See, for example, FIG. 13.

At block 2208, a PCM layer is deposited filling the openings and overlying the passivation layer. See, for example, FIG. 14.

At block 2210, a hard mask layer is deposited overlying the PCM layer. See, for example, FIG. 15.

At block 2212, the PCM layer and the hard mask layer are patterned respectively into a PCM structure and a hard mask atop the PCM structure, wherein the PCM structure has a pair of outer sidewalls respectively in the openings. See, for example, FIG. 16.

At block 2214, a first cap layer is deposited overlying the hard mask and lining the outer sidewalls. See, for example, FIG. 17.

At block 2216, the first cap layer, the hard mask, and the PCM structure are patterned to form a PCM recess overlying the heater at an active portion of the PCM structure. See, for example, FIG. 18.

At block 2218, a second cap layer is deposited overlying the first cap layer and lining the PCM recess. See, for example, FIG. 19.

At block 2220, a second dielectric layer is deposited covering the second cap layer. See, for example, FIG. 20.

At block 2222, vias are formed in the second dielectric layer and extending respectively from the electrodes. See, for example, FIG. 21.

While the block diagram 2200 of FIG. 22 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 23-27, a series of cross-sectional views 2300-2700 of some first alternative embodiments of the method of FIGS. 8-21 is provided.

Figure 23:
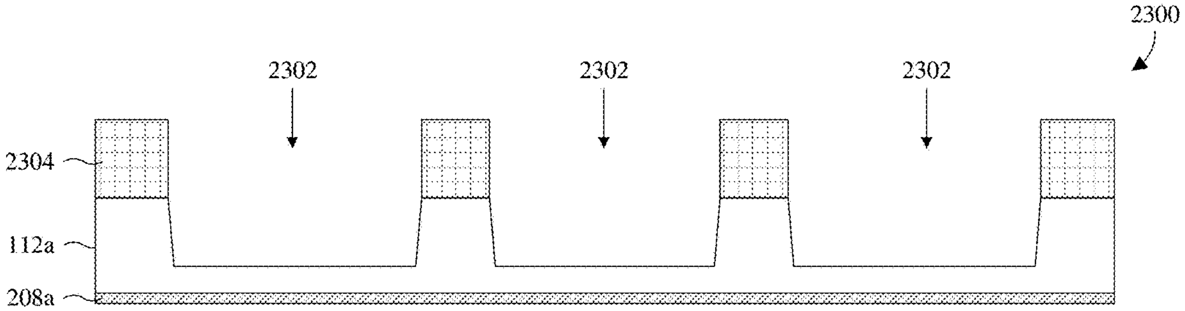
FIGS. 23-27 illustrate a series of cross-sectional views of some first alternative embodiments of the method of FIGS. 8-21.

As illustrated by the cross-sectional view 2300 of FIG. 23, the first dielectric layer 112*a* is patterned to form a plurality of openings 2302, which correspond to a pair of electrodes and a heater hereafter formed. Further, the first dielectric layer 112*a* overlies a first etch stop layer 208*a*, which overlies a substrate (not shown). In alternative embodiments, the first etch stop layer 208*a* is omitted.

The patterning may, for example, be performed by or using a photolithography/etching process or some other suitable patterning process. Further, the patterning may, for example, comprise etching the first dielectric layer 112*a* while a mask 2304 overlies the first dielectric layer 112*a* and subsequently removing the mask 2304.

Figure 24:
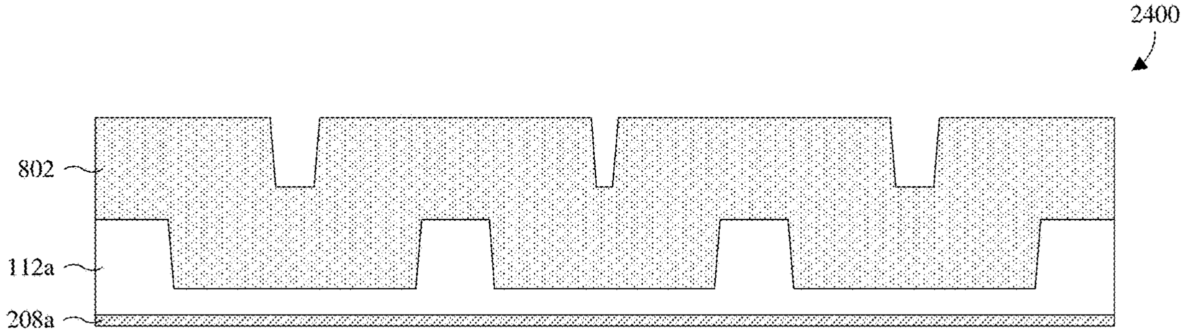

As illustrated by the cross-sectional view 2400 of FIG. 24, the conductive layer 802 is deposited covering the first dielectric layer 112*a* and filling the openings 2302.

Figure 25:
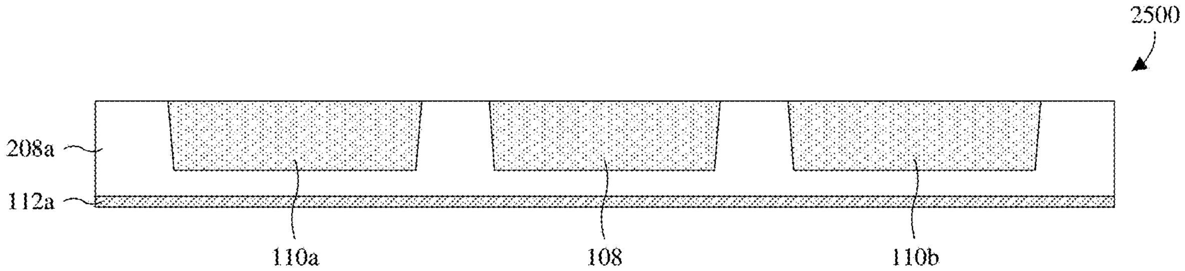

As illustrated by the cross-sectional view 2500 of FIG. 25, a planarization is performed into the conductive layer 802 to clear the conductive layer 802 from atop the first dielectric layer 112*a*. The planarization forms the first electrode 110*a*, the second electrode 110*b*, and the heater 108 respectively in the openings 2302. The planarization may, for example, be performed by a CMP and/or some other suitable planarization.

Figure 26:
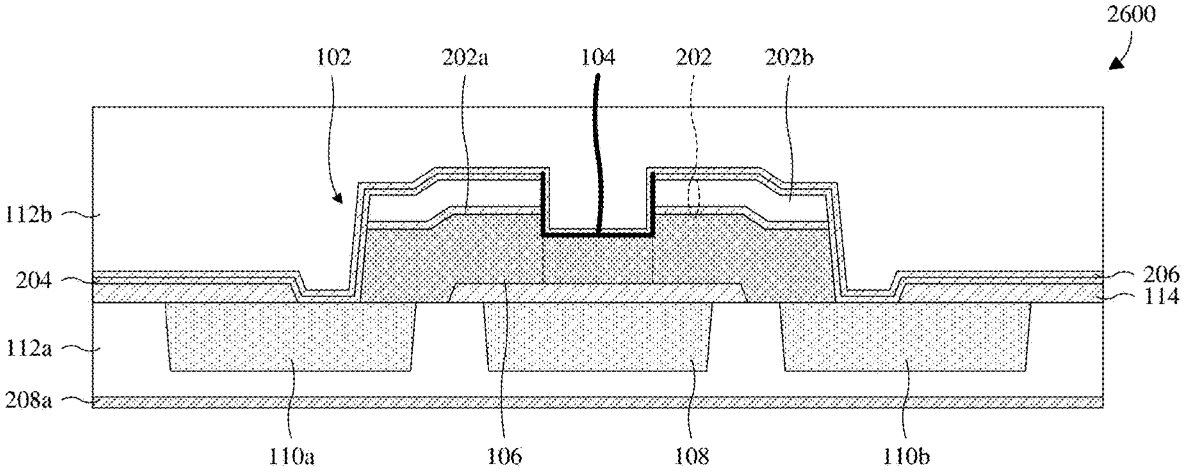

As illustrated by the cross-sectional view 2600 of FIG. 26, the acts described with regard to FIGS. 12-20 are performed as described above to form the PCM RF switch 102 underlying the second dielectric layer 112*b*.

Figure 27:
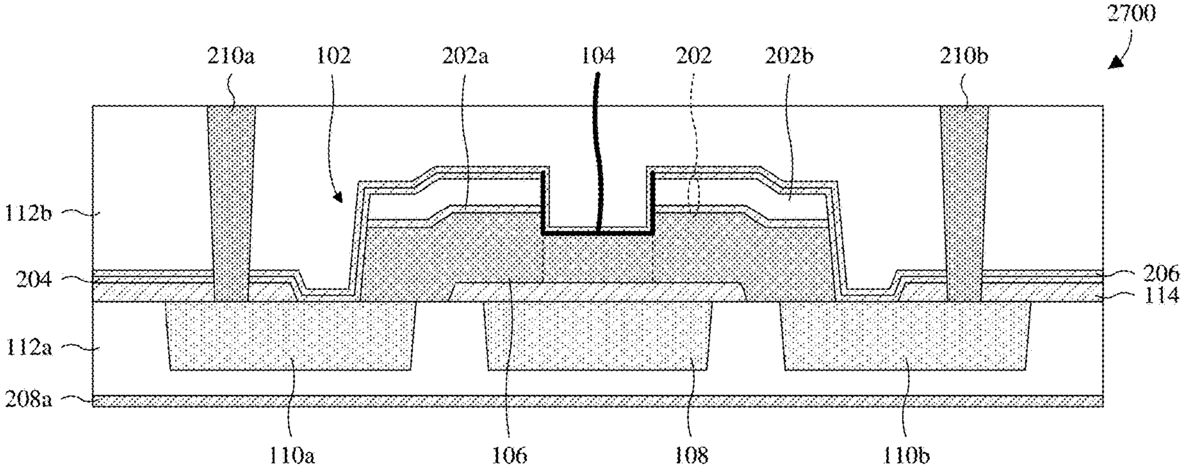

As illustrated by the cross-sectional view 2700 of FIG. 27, a first via 210*a* and a second via 210*b* are formed respectively overlying and extending from the first and second electrodes 110*a*, 110*b* as described with regard to FIG. 21.

While FIGS. 23-27 are described with reference to a method, it will be appreciated that the structures shown in these figures are not limited to the method but rather may stand alone separate of the method. While FIGS. 23-27 are described as a series of acts, it will be appreciated that the order of the acts may be altered in other embodiments. While FIGS. 23-27 illustrate and describe as a specific set of acts, some acts that are illustrated and/or described may be omitted in other embodiments. Further, acts that are not illustrated and/or described may be included in other embodiments.

With reference to FIGS. 28-42, a series of cross-sectional views 2800-4200 of some second alternative embodiments of the method of FIGS. 8-21 is provided. The method may, for example, be employed to form the PCM RF switch 102 of FIG. 5E, FIG. 5F, or some other suitable PCM RF switch.

Figure 28:
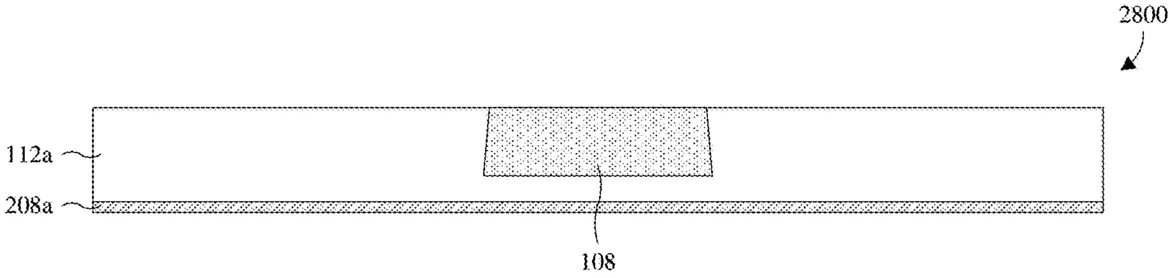
FIGS. 28-42 illustrate a series of cross-sectional views of some second alternative embodiments of the method of FIGS. 8-21.

As illustrated by the cross-sectional view 2800 of FIG. 28, the acts described with regard to FIGS. 8-11 are performed to form the heater 108 inset into a top of the first dielectric layer 112*a*. The acts are performed as described with regard to FIGS. 8-11, except that the first and second electrodes 110*a*, 110*b* are omitted (e.g., not formed). In alternative embodiments, the acts described with regard to FIGS. 23-25 are instead performed to form the heater 108. In such alternative embodiments, the acts are performed as described with regard to FIGS. 23-25, except that the first and second electrodes 110*a*, 110*b* are omitted.

Figure 29:
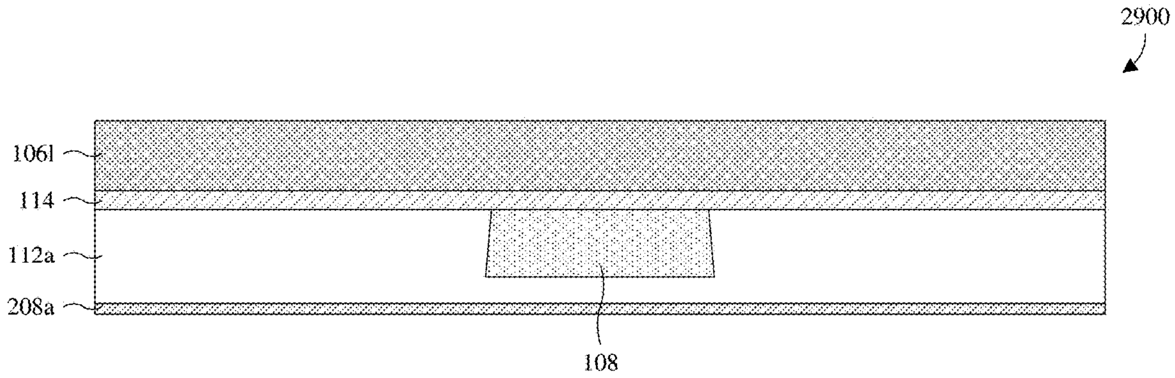

As illustrated by the cross-sectional view 2900 of FIG. 29, the passivation layer 114 is deposited on the first dielectric layer 112*a* and the heater 108. Further, the PCM layer 1061 is deposited on the passivation layer 114. The passivation layer 114 may, for example, be deposited as described with regard to FIG. 12 and/or the PCM layer 1061 may, for example, be described as described with regard to FIG. 14.

Figure 30:
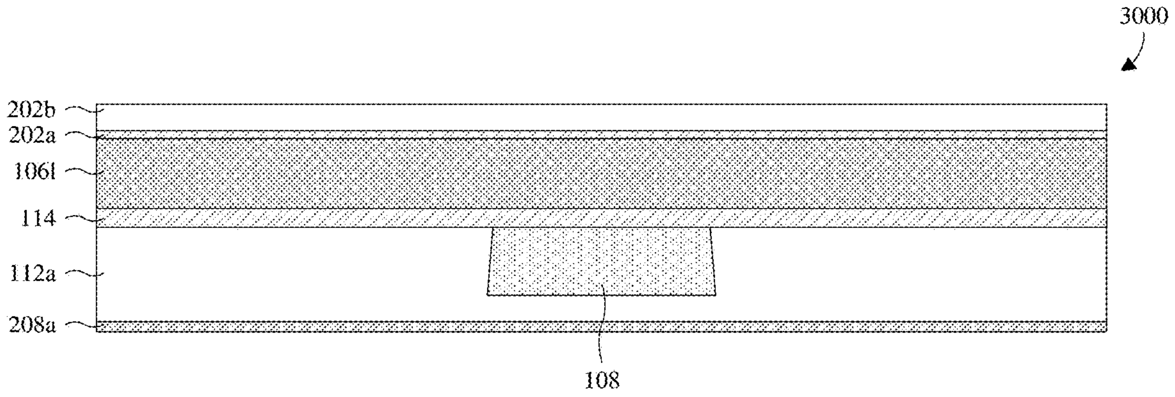
Figure 31:
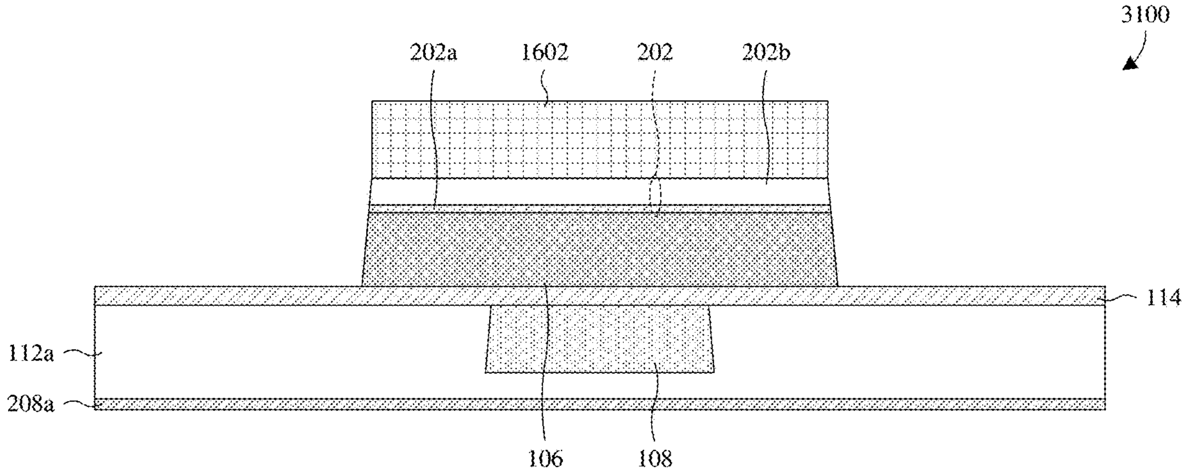
Figure 32:
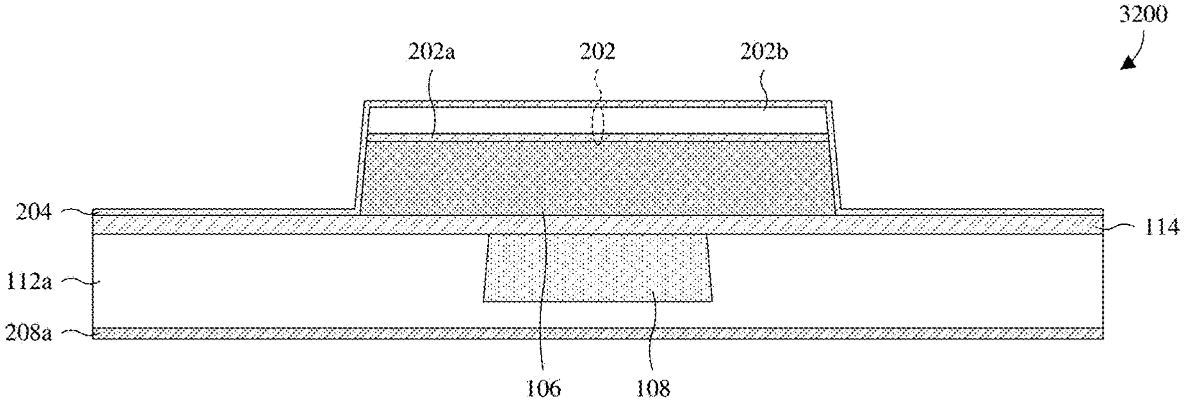
Figure 33:
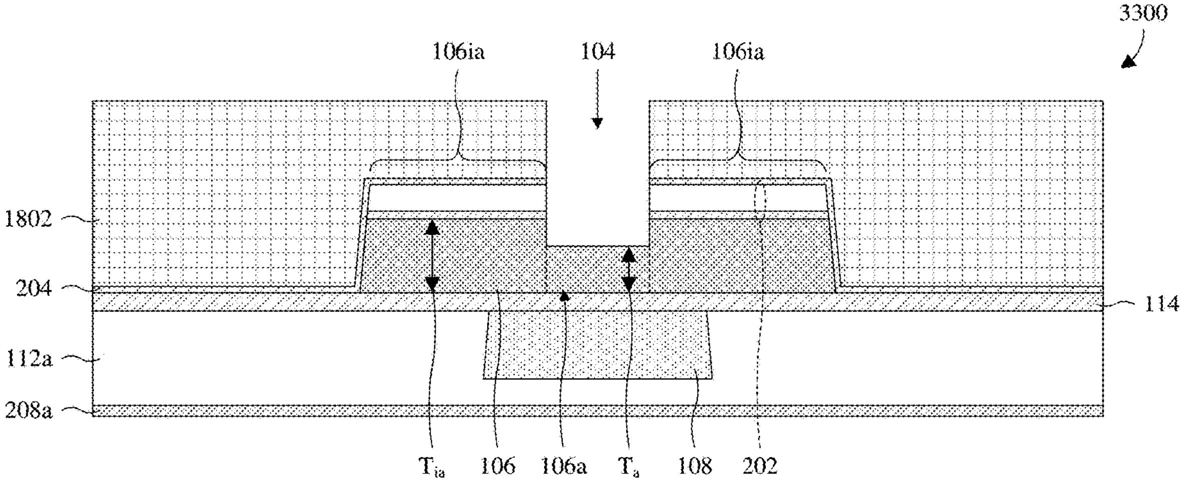
Figure 34:
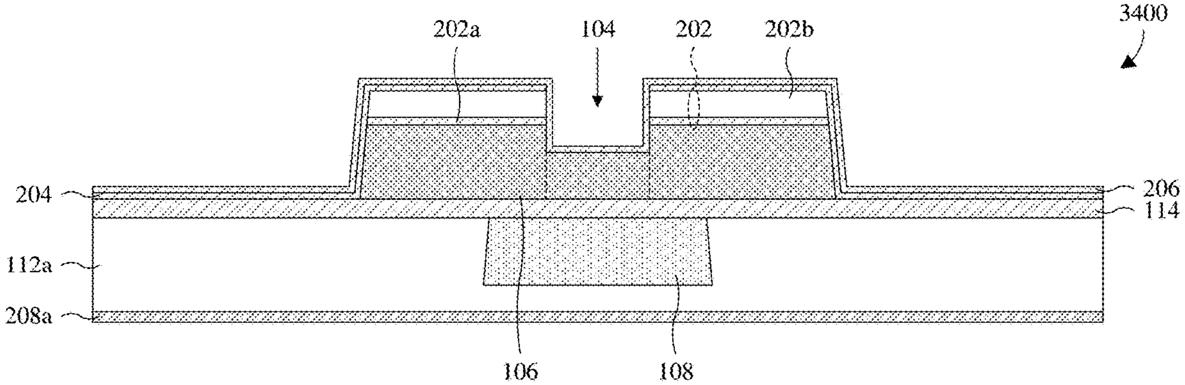

As illustrated by the cross-sectional views 3000-3400 of FIGS. 30-34, the acts described with regard to FIGS. 15-19 are respectively performed as described above. For example, FIG. 30 illustrates the acts described with regard to FIG. 15, FIG. 31 illustrates the acts described with regard to FIG. 16, FIG. 32 illustrates the acts described with regard to FIG. 17, and so on. This forms the PCM structure 106 with the PCM recess 104, and further forms the hard mask 202, the first cap layer 204, and the second cap layer 206.

Figure 35:
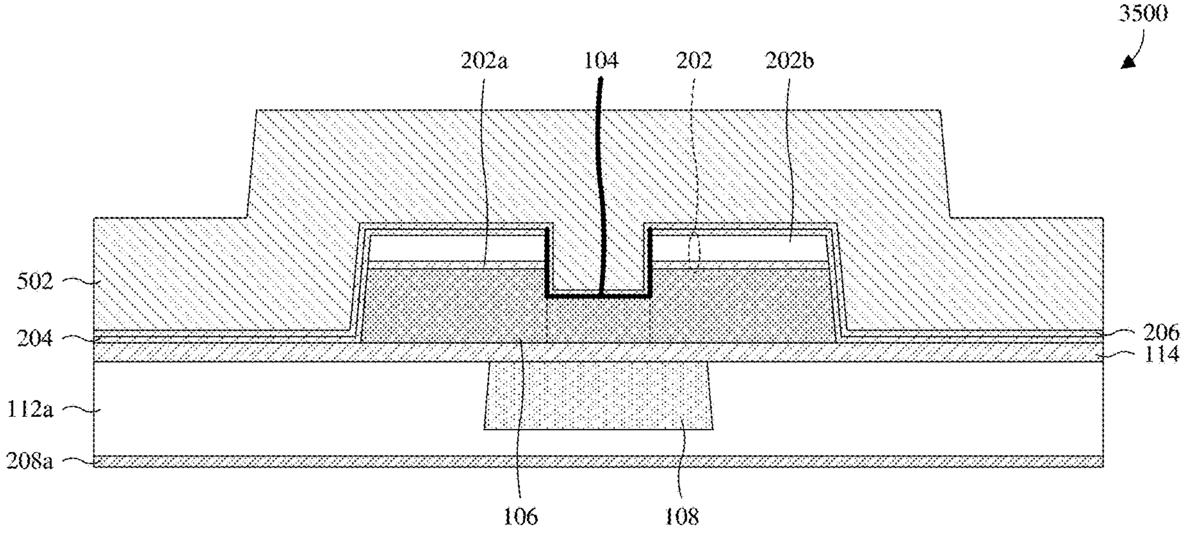

As illustrated by the cross-sectional view 3500 of FIG. 35, a planarization dielectric layer 502 is deposited over the second cap layer 206 and filling the PCM recess 104. In some embodiments, the planarization dielectric layer 502 is or comprises silicon oxide, some other suitable oxide and/or dielectric, or any combination of the foregoing. In some embodiments, the planarization dielectric layer 502 is the same material as the first dielectric layer 112*a* and/or is the same material as the second dielectric layer 112*b*.

Figure 36:
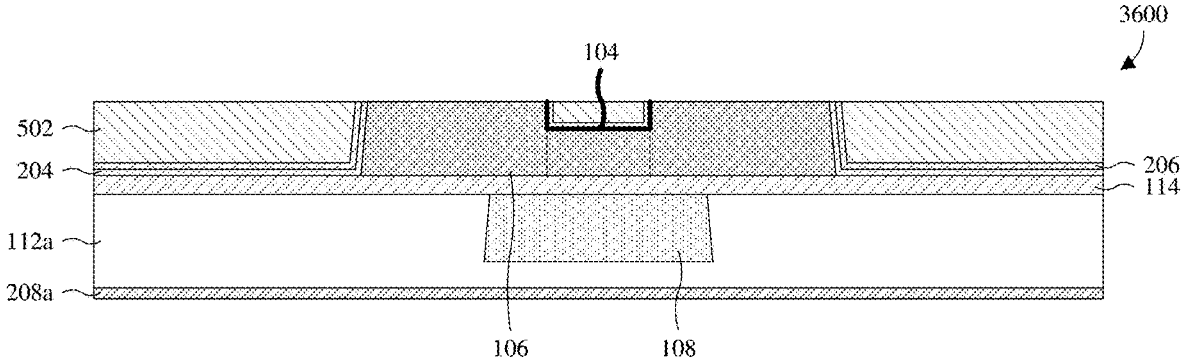

As illustrated by the cross-sectional view 3600 of FIG. 36, a planarization is performed into the planarization dielectric layer 502, the first cap layer 204, the second cap layer 206, and the hard mask 202. The planarization removes the hard mask 202 and levels individual top surfaces of the planarization dielectric layer 502, the first cap layer 204, the second cap layer 206, and the PCM structure 106 to form a flat or substantially surface. The planarization may, for example, be performed by a CMP and/or some suitable planarization process.

Figure 37:
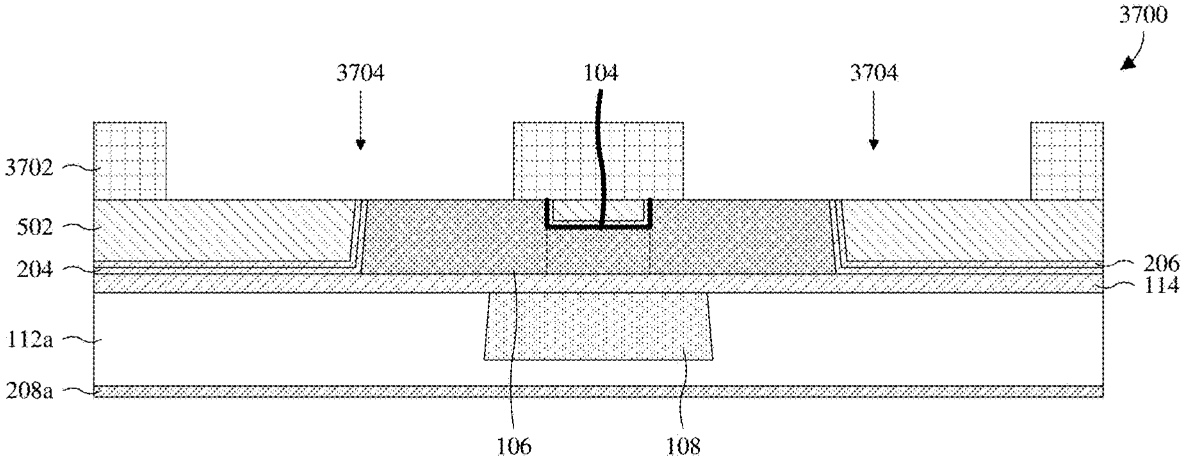

As illustrated by the cross-sectional view 3700 of FIG. 37, a mask 3702 is formed overlying the planarization dielectric layer 502 and the PCM structure 106. The mask 3702 covers the PCM recess 104 and has a pair of openings 3704 exposing the PCM structure 106, respectively on opposite sides of the PCM structure 106. The mask 3702 may, for example, be or comprise photoresist and/or some other suitable material. The mask 3702 may, for example, be formed by photolithography and/or by some other suitable process.

Figure 38:
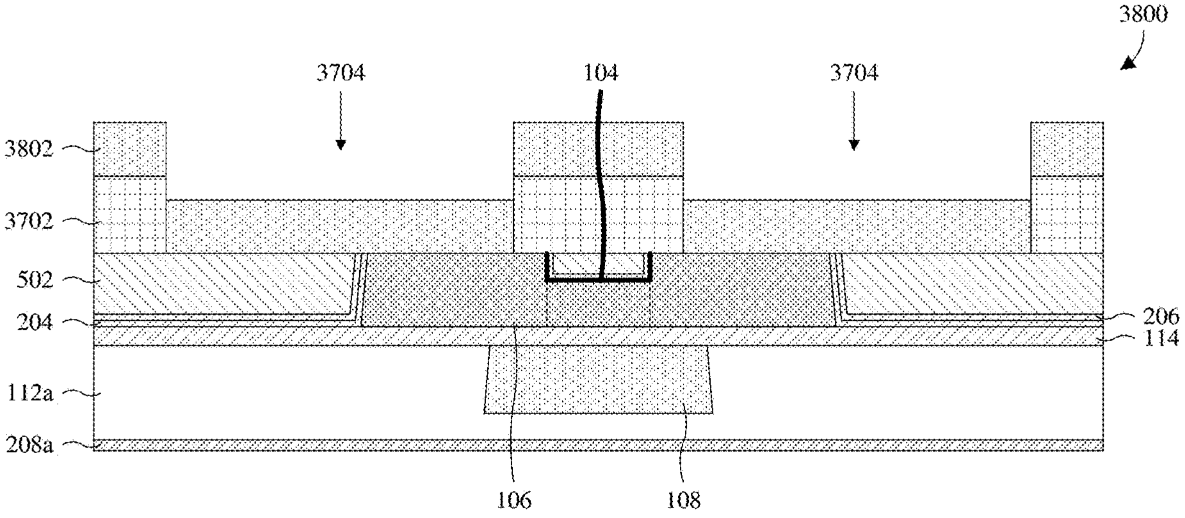

As illustrated by the cross-sectional view 3800 of FIG. 38, a conductive layer 3802 is deposited overlying the mask 3702 and in the openings 3704. Further, the conductive layer 3802 is deposited so material of the conductive layer 3802 accumulates vertically and does not accumulate laterally, or minimally accumulates laterally, from sidewalls of the mask 3702 in the openings 3704. In some embodiments, the conductive layer 3802 is or comprises tungsten and/or some other suitable material having low resistance and high heat resistance. In some embodiments, the conductive layer 3802 is the same material as the heater 108.

In some embodiments, the conductive layer 3802 is deposited by an anisotropic deposition process. For example, the conductive layer 3802 may be deposited by an evaporation deposition process and/or some other suitable deposition process. Further, in some embodiments, sidewalls of the mask 3702 in the openings 3704 are formed slanted, such that individual widths of the openings 3704 increase top to bottom. The slanted sidewalls may minimize lateral accumulation from the slanted sidewalls.

Figure 39:
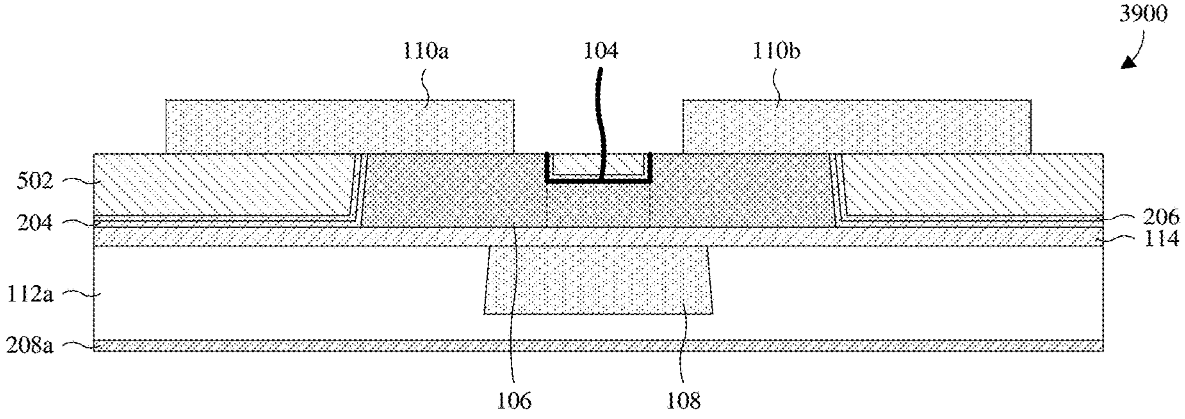

As illustrated by the cross-sectional view 3900 of FIG. 39, the mask 3702 is removed, thereby lifting off portions of the conductive layer 3802 overlying the mask 3702 and forming the first and second electrodes 110*a*, 110*b*. While FIGS. 37-39 illustrate an example of a metal lift off process for forming the first and second electrodes 110*a*, 110*b*, other suitable processes for forming the first and second electrodes 110*a*, 110*b* are amenable.

Figure 40:
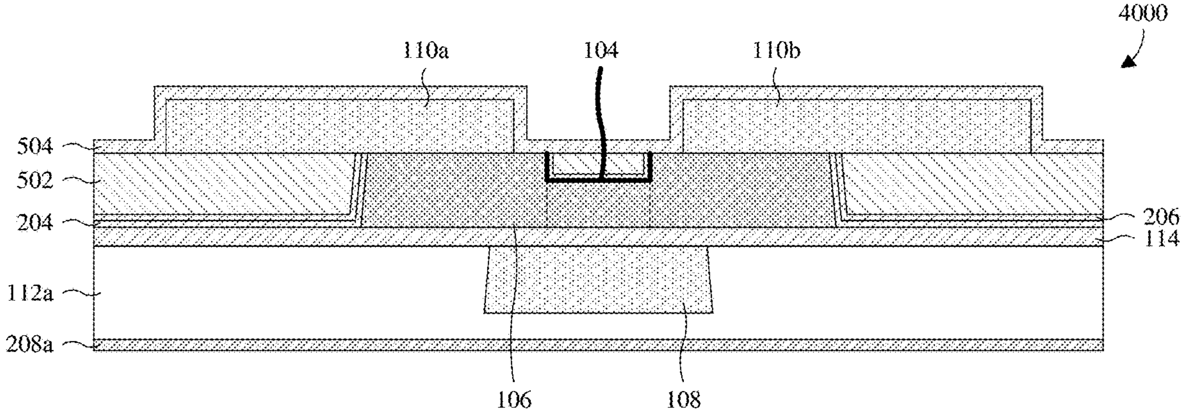

As illustrated by the cross-sectional view 4000 of FIG. 40, a third cap layer 504 is deposited overlying and lining the first and second electrodes 110*a*, 110*b*. The third cap layer 504 may, for example, be or comprise silicon nitride and/or some other suitable dielectric. In some embodiments, the third cap layer 504 is the same material as the first cap layer 204 and/or the second cap layer 206.

Figure 41:
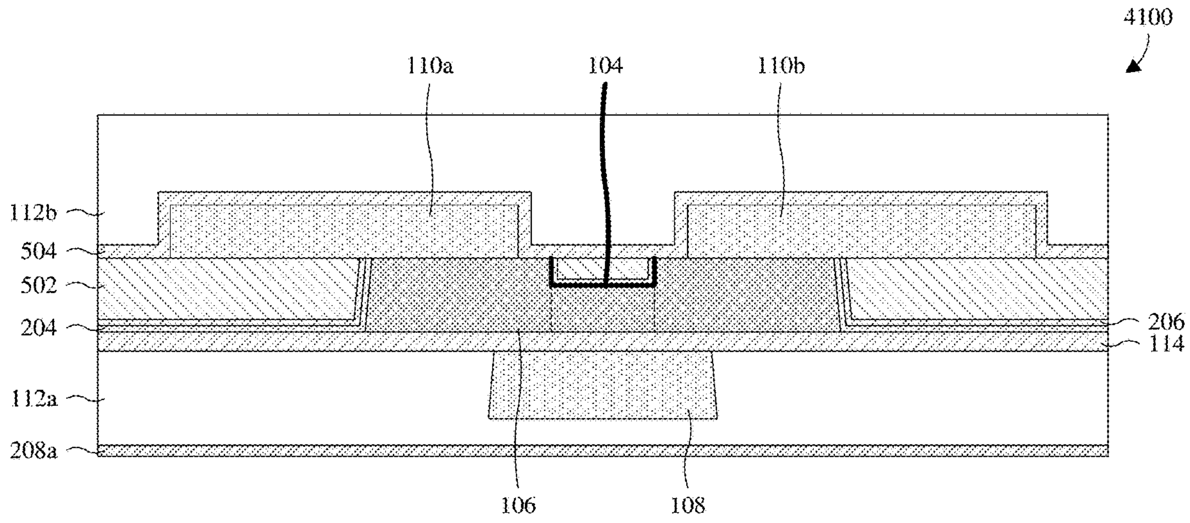

As illustrated by the cross-sectional view 4100 of FIG. 41, the acts described with regard to FIG. 20 are performed as described above to form the second dielectric layer 112*b*.

Figure 42:
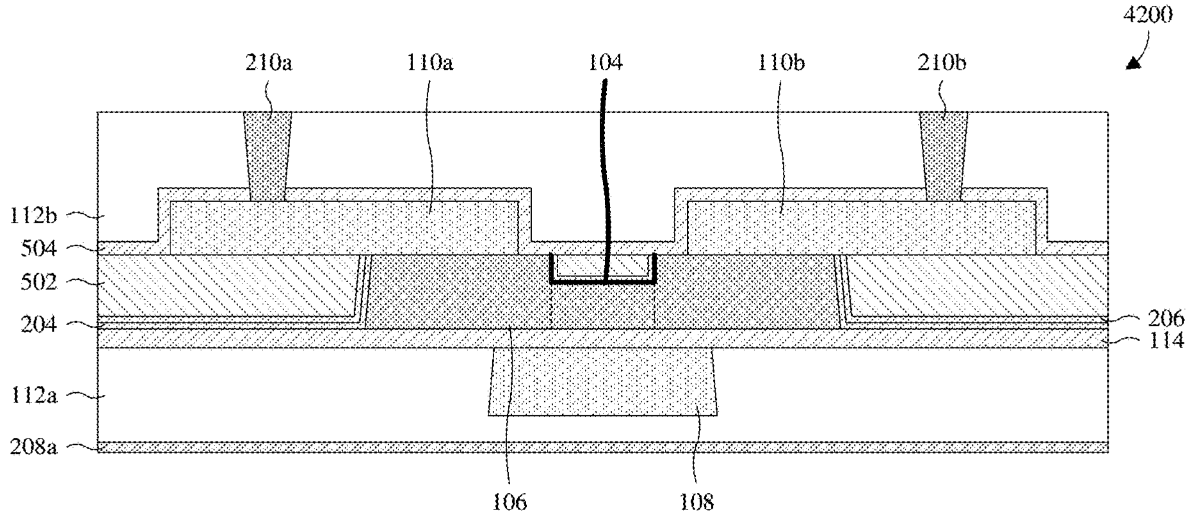

As illustrated by the cross-sectional view 4200 of FIG. 42, the acts described with regard to FIG. 21 are performed as described above to form the first and second vias 210*a*, 210*b*, respectively overlying and extending from the first and second electrodes 110*a*, 110*b*.

While FIGS. 28-42 are described with reference to a method, it will be appreciated that the structures shown in these figures are not limited to the method but rather may stand alone separate of the method. While FIGS. 28-42 are described as a series of acts, it will be appreciated that the order of the acts may be altered in other embodiments. While FIGS. 28-42 illustrate and describe as a specific set of acts, some acts that are illustrated and/or described may be omitted in other embodiments. Further, acts that are not illustrated and/or described may be included in other embodiments.

Figure 43:
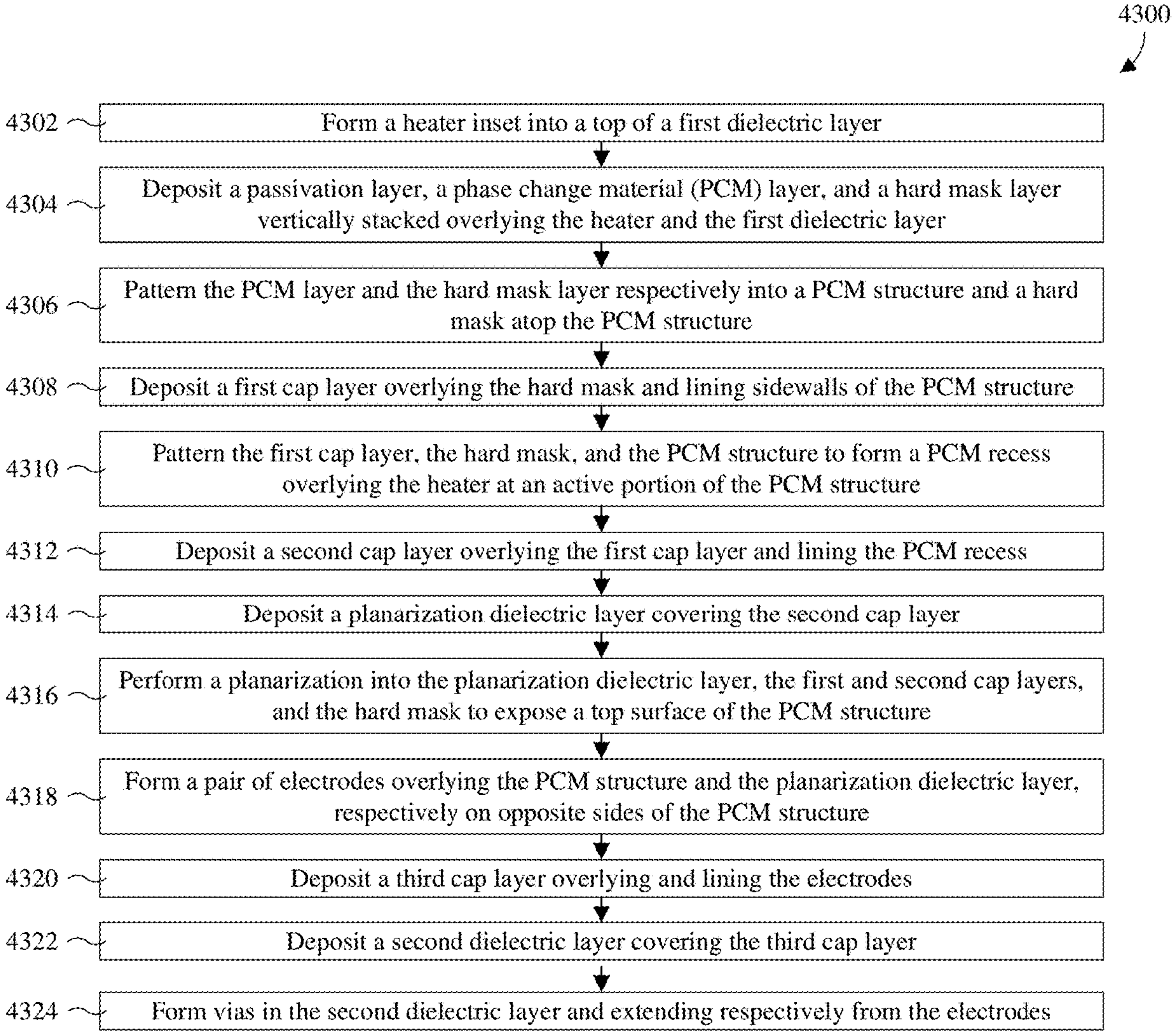
FIG. 43 illustrates a block diagram of some embodiments of the method of FIGS. 28-42.

With reference to FIG. 43, a block diagram 4300 of some embodiments of the method of FIGS. 28-42 is provided.

At block 4302, a heater is formed inset into a top of a first dielectric layer. See, for example, FIG. 28.

At block 4304, a passivation layer, a PCM layer, and a hard mask layer are formed vertically stacked overlying the heater and the first dielectric layer. See, for example, FIGS. 29 and 30.

At block 4306, the PCM layer and the hard mask layer are patterned respectively into a PCM structure and a hard mask atop the PCM structure. See, for example, FIG. 31.

At block 4308, a first cap layer is deposited overlying the hard mask and lining sidewalls of the PCM structure. See, for example, FIG. 32.

At block 4310, the first cap layer, the hard mask, and the PCM structure are patterned to form a PCM recess overlying the heater at an active portion of the PCM structure. See, for example, FIG. 33.

At block 4312, a second cap layer is deposited overlying the first cap layer and lining the PCM recess. See, for example, FIG. 34.

At block 4314, a planarization dielectric layer is deposited covering the second cap layer. See, for example, FIG. 35.

At block 4316, a planarization is performed into the planarization dielectric layer, the first and second cap layers, and the hard mask to expose a top surface of the PCM structure. See, for example, FIG. 36.

At block 4318, a pair of electrodes are formed overlying the PCM structure and the planarization dielectric layer, respectively on opposite sides of the PCM structure. See, for example, FIGS. 37-39.

At block 4320, a third cap layer is deposited overlying and lining the electrodes. See, for example, FIG. 40.

At block 4322, a second dielectric layer is deposited covering the third cap layer. See, for example, FIG. 41.

At block 4324, vias are formed in the second dielectric layer, extending respectively from the electrodes. See, for example, FIG. 42.

While the block diagram 4300 of FIG. 43 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 44-47, a series of cross-sectional views 4400-4700 of some embodiments of a method for forming an integrated chip comprising a PCM RF switch with a PCM recess is provided. The method may, for example, be employed to form the integrated chip of FIG. 6 or some other suitable integrated chip.

Figure 44:
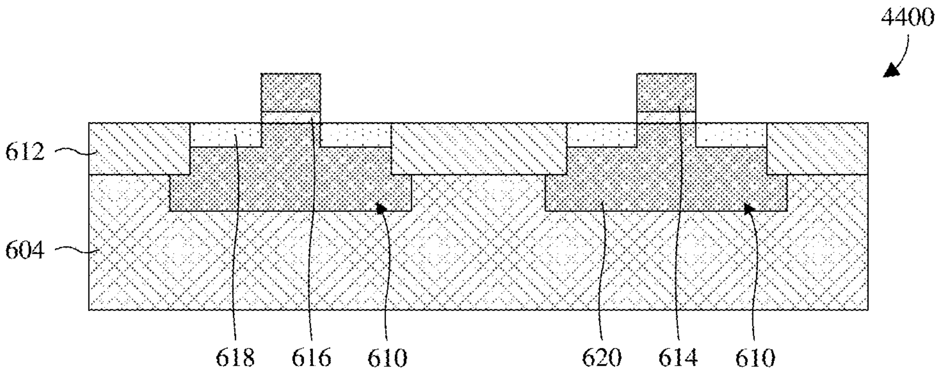
FIGS. 44-47 illustrate a series of cross-sectional views of some embodiments of a method for forming an integrated chip comprising a PCM RF switch with a PCM recess.

As illustrated by the cross-sectional view 4400 of FIG. 44, a pair of logic devices 610 are formed on a semiconductor substrate 604, separated from each other by an isolation structure 612. The logic devices 610 are illustrated as planar FETs. However, the logic devices 610 may alternatively be FinFETs, GAA FETs, some other suitable type(s) of logic device and/or transistor, or any combination of the foregoing. In alternative embodiments, more or less logic devices 610 may be formed and/or devices other than logic devices 610 may additionally or alternatively be formed on the semiconductor substrate 604.

The logic devices 610 comprise individual gate electrodes 614, individual gate dielectric layers 616, individual pairs of source/drain regions 618, and individual wells 620. In alternative embodiments, the wells 620 are omitted.

Figure 45:
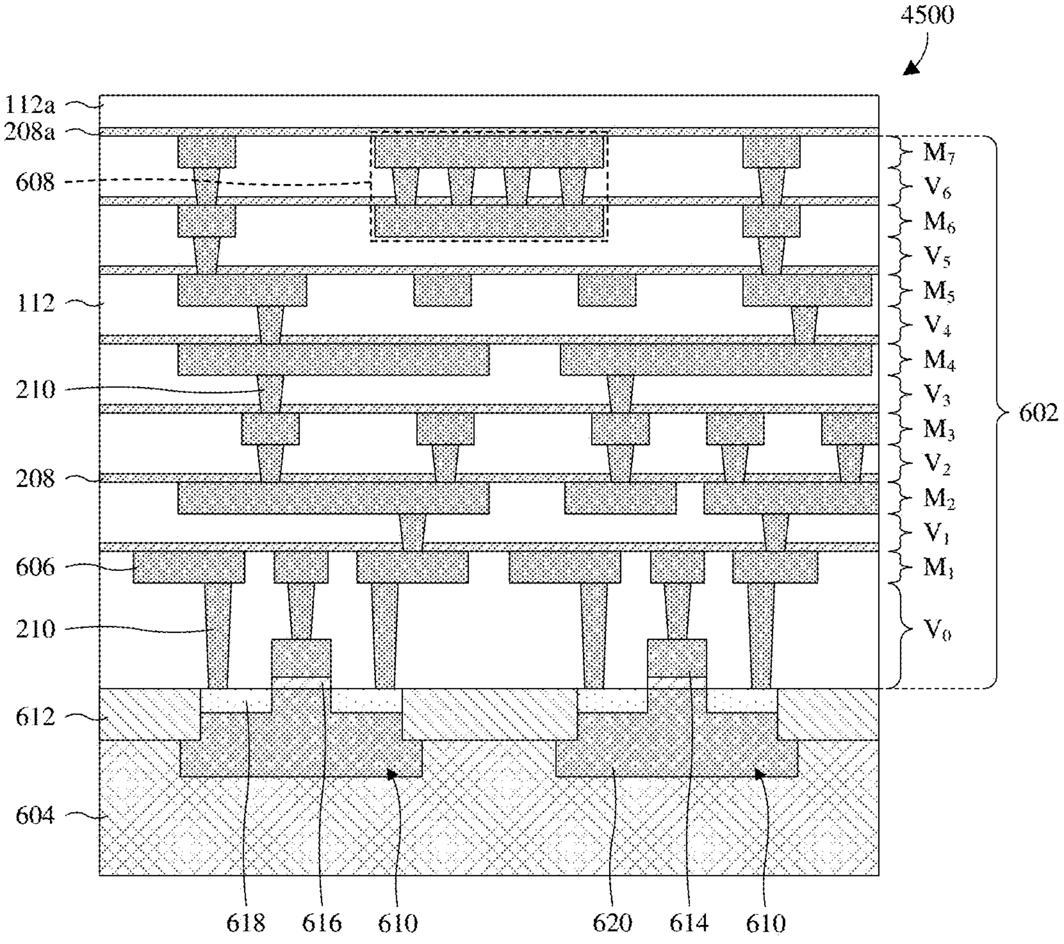

As illustrated by the cross-sectional view 4500 of FIG. 45, an interconnect structure 602 is partially formed overlying and electrically coupled to the logic devices 610. The interconnect structure 602 comprises a plurality of wires 606 and a plurality of vias 210. The plurality of wires 606 are grouped into a plurality of wire levels, and the plurality of vias 210 are grouped into a plurality of via levels alternatingly stacked with the plurality of wire levels. The wire levels are labeled $M_1$, $M_2$, and so on to $M_7$ from a bottom of the interconnect structure 602 to a top of the interconnect structure 602. The via levels are labeled $V_0$, $V_1$, and so on to $V_6$ from the bottom of the interconnect structure 602 to the top of the interconnect structure 602.

The interconnect structure 602 is formed so wires at the wire levels $M_6$ and $M_7$, as well as vias at the via level $V_6$, form a heat sink 608 at a top of the interconnect structure 602. In alternative embodiments, the heat sink 608 is omitted. The heat sink 608 facilitates dissipation of heat generated by a heater hereafter formed. Further, in alternative embodiments, the interconnect structure 602 is formed with more or less wire levels and/or more or less via levels. Further yet, in alternative embodiments, the interconnect structure 602 is formed with a MEOL between the via level $V_0$ and the logic devices 610.

Also illustrated by the cross-sectional view 4500 of FIG. 45, a lower dielectric structure is formed surrounding the interconnect structure 602. The lower dielectric structure comprises a plurality of interconnect dielectric layers 112 and a plurality of etch stop layers 208 alternatingly stacked from a bottom of the interconnect structure 602 to a top of the interconnect structure 602. The plurality of etch stop layers 208 comprise a first etch stop layer 208*a* at a top of the interconnect structure 602, and the plurality of interconnect dielectric layers 112 comprise a first dielectric layer 112*a* overlying the first etch stop layer 208*a*.

Figure 46:
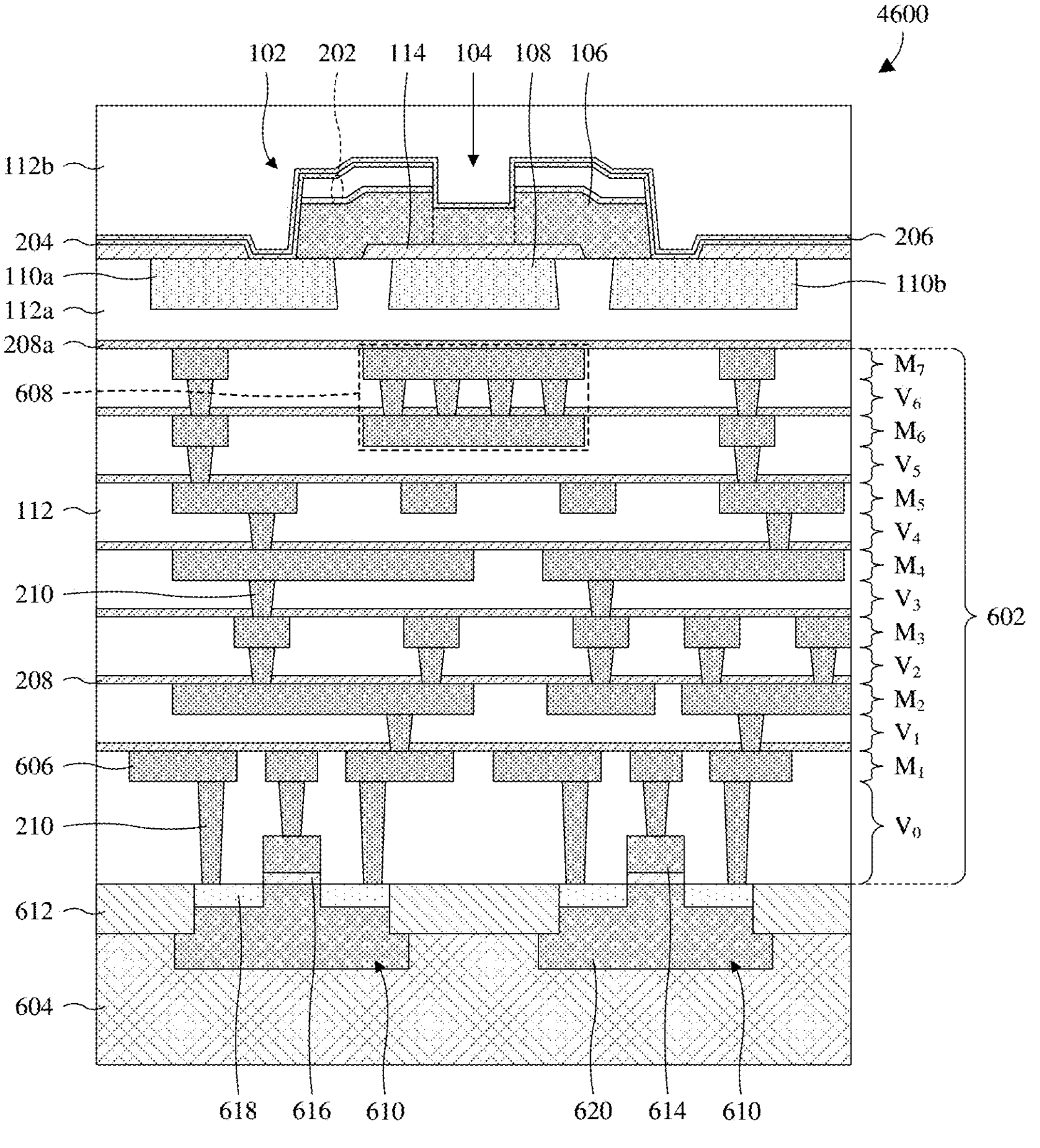

As illustrated by the cross-sectional view 4600 of FIG. 46, the acts described with regard to FIGS. 8-20 are performed to form the PCM RF switch 102. In alternative embodiments, the acts described with regard to FIGS. 23-26 are performed to form the PCM RF switch 102. In other alternative embodiments, the acts described with regard to FIGS. 28-41 are performed to form the PCM RF switch 102. Such other alternative embodiments may, for example, form the PCM RF switch 102 and the integrated chip as in FIG. 7.

Figure 47:
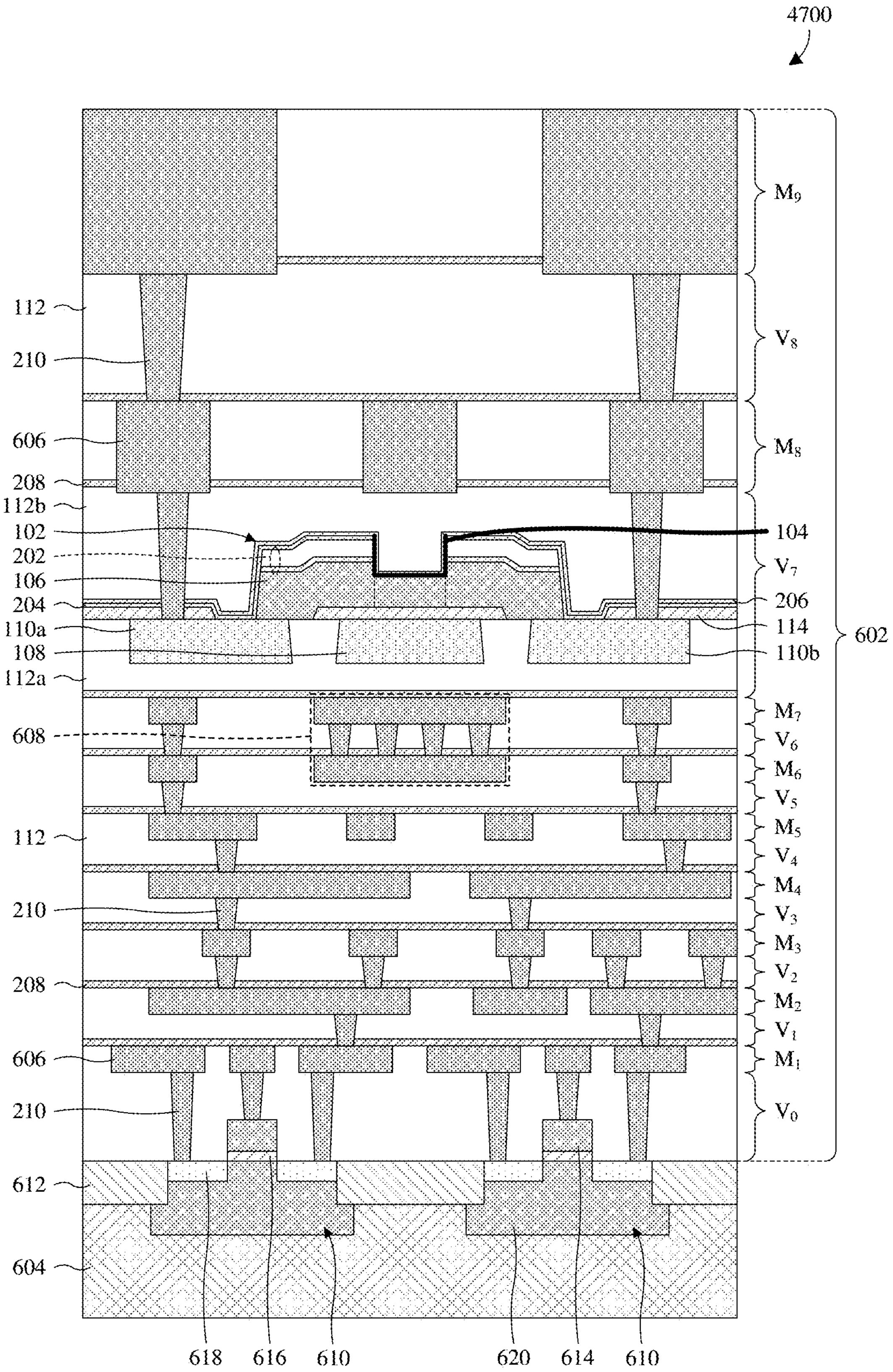

As illustrated by the cross-sectional view 4700 of FIG. 47, the interconnect structure 602 is completed over and electrically coupled to the PCM RF switch 102. The interconnect structure 602, as completed, includes additional via levels $V_7$, $V_8$, and $V_9$ and additional wire levels $M_8$ and $M_9$ alternatingly stacked over the PCM RF switch 102.

Also illustrated by the cross-sectional view 4700 of FIG. 47, an upper dielectric structure is formed surrounding the additional via levels $V_7$, $V_8$, and $V_9$ and the additional wire levels $M_8$ and $M_9$. The upper dielectric structure comprises a plurality of additional interconnect dielectric layers 112 and a plurality of additional etch stop layers 208 alternatingly stacked with the additional interconnect dielectric layers 112. The plurality of additional interconnect dielectric layers 112 include a second dielectric layer 112*b* atop the PCM RF switch 102.

While FIGS. 44-47 are described with reference to a method, it will be appreciated that the structures shown in these figures are not limited to the method but rather may stand alone separate of the method. While FIGS. 44-47 are described as a series of acts, it will be appreciated that the order of the acts may be altered in other embodiments. While FIGS. 44-47 illustrate and describe as a specific set of acts, some acts that are illustrated and/or described may be omitted in other embodiments. Further, acts that are not illustrated and/or described may be included in other embodiments.

In some embodiments, the present disclosure provides a semiconductor device, comprising: a heater over a substrate; a PCM structure over the heater; and a first electrode and a second electrode respectively on opposite sides of the heater and electrically coupled to the PCM structure respectively on the opposite sides; wherein a top of the PCM structure has a recess that overlies the heater and that has a width different (e.g., less) than a width of the heater. In some embodiments, a width of the PCM structure is greater than the width of the heater. In some embodiments, the first and second electrodes underlie the PCM structure and are level with the heater. In some embodiments, the first and second electrodes overlie the PCM structure and extend along individual sidewalls of the PCM structure. In some embodiments, the first and second electrodes have individual bottommost surfaces overlying a top surface of the PCM structure. In some embodiments, the heater is laterally between the first and second electrodes in a first dimension, wherein the heater has a pair of pads laterally spaced from each other in a second dimension orthogonal to the first dimension and between which the first and second electrodes are laterally arranged. In some embodiments, the semiconductor device further comprises: a hard mask overlying the PCM structure, wherein the hard mask and the PCM structure form a first common sidewall overlying the heater in the recess and further form a second common sidewall overlying the first electrode outside the recess; a first cap layer overlying the hard mask, wherein the first cap layer further forms the first common sidewall and lines the second common sidewall; and a second cap layer overlying the first cap layer and lining the first common sidewall and the second common sidewall.

In some embodiments, the present disclosure provides another a semiconductor device, including: a heater over a substrate; a PCM structure overlying the heater; and a first electrode and a second electrode respectively on opposite sides of the heater and electrically coupled to the PCM structure respectively on the opposite sides; wherein the PCM structure has a first thickness overlying the heater, and further has a second thickness laterally offset from the heater, and wherein the first thickness is less than the second thickness. In some embodiments, the PCM structure has a central portion, which overlies the heater and has the first thickness throughout its entirety, wherein a remainder of the PCM structure is thicker than the central portion. In some embodiments, a width of the central portion is less than a width of the heater, which is less than a width of the PCM structure. In some embodiments, the remainder of the PCM structure partially overlies the heater. In some embodiments, the semiconductor device further includes a passivation layer underlying the PCM structure, between the PCM structure and the heater, to separate the PCM structure from the heater. In some embodiments, the passivation layer has a bottom surface level with a bottom surface of the PCM structure and further has a sidewall facing the PCM structure.

In some embodiments, the present disclosure provides a method for forming a semiconductor device, including: forming a heater over a substrate; forming a pair of electrodes respectively on opposite sides of the heater; depositing a passivation layer overlying the heater; forming a PCM structure overlying the passivation layer and the heater; and performing an etch into the PCM structure to form a recess overlying the heater. In some embodiments, a portion of the PCM structure underlying the recess has a first thickness and spans an entire width of the recess, wherein a remainder of the PCM structure is thicker than the portion. In some embodiments, the passivation layer is deposited overlying the pair of electrodes, wherein the method further includes: patterning the passivation layer to form a pair of openings respectively exposing the pair of electrodes and laterally offset from the heater, wherein the PCM structure is formed in the pair of openings. In some embodiments, the forming of the PCM structure includes: depositing a PCM layer overlying the passivation layer; and patterning the PCM layer into the PCM structure, such the PCM structure has a pair of individual sidewalls respectively overlying the pair of electrodes respectively in the pair of openings. In some embodiments, the method further includes: depositing a dielectric layer overlying the PCM structure and filling the recess; and performing a planarization into the dielectric layer until a top surface of the dielectric layer is level with a top surface of the PCM structure. In some embodiments, the forming of the PCM structure includes: depositing a PCM layer overlying the passivation layer; forming a hard mask layer overlying the PCM layer; and performing an additional etch into the PCM layer and the hard mask layer with a common mask in place to respectively form the PCM structure and a hard mask atop the PCM structure, wherein the planarization removes the hard mask. In some embodiments, the method further includes depositing a conductive layer over the substrate, wherein the heater and the pair of electrodes are formed from the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
- forming a heater over a substrate;
- forming a pair of electrodes respectively on opposite sides of the heater;
- depositing a passivation layer overlying the heater;
- forming a phase change material (PCM) structure overlying the passivation layer and the heater; and
- performing an etch into the PCM structure to form a recess overlying the heater.

2. The method according to claim 1, wherein a portion of the PCM structure underlying the recess has a first thickness and spans an entire width of the recess, and wherein a remainder of the PCM structure is thicker than the portion.

3. The method according to claim 1, wherein the passivation layer is deposited overlying the pair of electrodes, and wherein the method further comprises:
- patterning the passivation layer to form a pair of openings respectively exposing the pair of electrodes and laterally offset from the heater, wherein the PCM structure is formed in the pair of openings.

4. The method according to claim 2, wherein the forming of the PCM structure comprises:
- depositing a PCM layer overlying the passivation layer; and
- patterning the PCM layer into the PCM structure, such that the PCM structure has a pair of individual sidewalls respectively overlying the pair of electrodes respectively in the pair of openings.

5. The method according to claim 2, wherein the forming of the PCM structure comprises:
- depositing a PCM layer overlying the passivation layer;
- forming a hard mask layer overlying the PCM layer; and
- performing an additional etch into the PCM layer and the hard mask layer with a common mask in place to respectively form the PCM structure and a hard mask atop the PCM structure.

6. The method according to claim 1, further comprising:
- depositing a conductive layer over the substrate, wherein the heater and the pair of electrodes are formed from the conductive layer.

7. The method according to claim 1, wherein a width of the recess is less than a width of the heater.

8. A method for forming a semiconductor device, comprising:
- forming a heater, a first electrode, and a second electrode over a substrate with the heater being between the first and second electrodes;
- depositing a passivation layer overlying the heater, the first electrode, and the second electrode;
- patterning the passivation layer to form a pair of openings spaced from the heater and respectively exposing the first and second electrodes;
- forming a phase change material (PCM) structure overlying the passivation layer and the heater and extending in the pair of openings to the first and second electrodes; and
- forming a cap layer overlying the first electrode, the second electrode, and the PCM structure and having a portion that is inset into a top of the PCM structure at a location overlying the heater.

9. The method according to claim 8, wherein the portion of the cap layer is formed overlying a width-wise center of the heater and laterally offset from outer sidewalls of the PCM structure.

10. The method according to claim 8, wherein the forming of the cap layer comprises:

patterning the PCM structure to form an additional opening that overlies and is spaced from the heater and the passivation layer; and depositing the cap layer lining the additional opening.

11. The method according to claim 8, wherein the forming of the PCM structure comprises:

depositing a PCM layer filling the pair of openings and overlying the passivation layer and the heater;

depositing a hard mask layer overlying the PCM layer; and patterning the PCM layer and the hard mask layer according to a common pattern, wherein the cap layer is further formed overlying the hard mask layer and extending through the hard mask layer into the PCM structure.

12. The method according to claim 8, wherein the pair of openings are formed only partially overlapping with the first and second electrodes.

13. The method according to claim 8, further comprising:

forming an interconnect structure over the substrate and comprising a plurality of wire levels and a plurality of via levels, wherein the plurality of wire levels and the plurality of via levels are alternatingly stacked over the substrate and form a heatsink at a top of the interconnect structure, wherein the heatsink comprises a first wire, a second wire overlying the first wire, and a plurality of vias extending from the first wire to the second wire, and wherein the heater is formed overlying and spaced from the heatsink.

14. The method according to claim 8, wherein the forming of the heater, the first electrode, and the second electrode comprises:

patterning a dielectric layer that overlies the substrate to form a trio of additional openings corresponding to the heater, the first electrode, and the second electrode;

depositing a conductive layer overlying the dielectric layer and filling the trio of additional openings; and performing a planarization into the conductive layer.

15. A method for forming a semiconductor device, comprising:

forming a heater over a substrate;

forming a pair of electrodes spaced from and respectively on opposite sides of the heater in a first direction;

depositing a passivation layer overlying the heater; and forming a phase change material (PCM) structure overlying the passivation layer and the heater and extending through the passivation layer to the pair of electrodes, wherein the PCM structure has a first thickness overlying a width-wise center of the heater and further has a second thickness greater than the first thickness overlying a periphery of the heater.

16. The method according to claim 15, wherein the heater comprises a first pad and a second pad spaced from each other in a second direction orthogonal to the first direction and further comprises a central region elongated in the second direction from the first pad to the second pad, wherein the pair of electrodes are between the first and second pads in the second direction.

17. The method according to claim 16, further comprising:

a dielectric layer overlying the PCM structure and having a protrusion protruding into a top of the PCM structure, such that the PCM structure has the first thickness underlying the protrusion, wherein the protrusion has a length in the second direction less than a separation between the first and second pads in the second direction.

18. The method according to claim 15, wherein the forming of the PCM structure comprises:

depositing a PCM layer overlying the passivation layer;

performing a first etch into the PCM layer to demarcate outer sidewalls of the PCM structure; and performing a second etch into the PCM structure to form a recess in the PCM structure, overlying the heater.

19. The method according to claim 18, further comprising:

forming a first cap layer overlying the PCM structure and extending through the passivation layer to the pair of electrodes before the second etch; and forming a second cap layer overlying the first cap layer and lining the recess after the second etch.

20. The method according to claim 15, further comprising:

depositing a conductive layer over the substrate;

forming a mask atop the conductive layer; and performing an etch into the conductive layer with the mask in place to concurrently form the heater and the pair of electrodes.

* * * * *